(12) United States Patent
Huang et al.

(10) Patent No.: US 10,622,473 B2
(45) Date of Patent: Apr. 14, 2020

(54) HIGH VOLTAGE METAL OXIDE SEMICONDUCTOR DEVICE AND MANUFACTURING METHOD THEREOF

(71) Applicant: RICHTEK TECHNOLOGY CORPORATION, Zhubei, Hsinchu (TW)

(72) Inventors: Tsung-Yi Huang, Hsinchu (TW); Chu-Feng Chen, Hsinchu (TW); YU-Ting Yeh, Miaoli (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/104,921

(22) Filed: Aug. 19, 2018

(65) Prior Publication Data

US 2019/0115468 A1 Apr. 18, 2019

(30) Foreign Application Priority Data

Oct. 16, 2017 (TW) .............................. 106135368 A

(51) Int. Cl.
| | | |
|---|---|---|
| H01L 29/78 | (2006.01) | |
| H01L 29/10 | (2006.01) | |
| H01L 29/08 | (2006.01) | |
| H01L 21/266 | (2006.01) | |
| H01L 29/66 | (2006.01) | |
| H01L 29/49 | (2006.01) | |
| H01L 29/06 | (2006.01) | |
| H01L 29/423 | (2006.01) | |

(52) U.S. Cl.
CPC ........ *H01L 29/7816* (2013.01); *H01L 21/266* (2013.01); *H01L 29/0865* (2013.01); *H01L 29/0869* (2013.01); *H01L 29/0882* (2013.01); *H01L 29/1079* (2013.01); *H01L 29/1095* (2013.01); *H01L 29/4916* (2013.01); *H01L 29/66681* (2013.01); *H01L 29/66689* (2013.01); *H01L 29/0692* (2013.01); *H01L 29/0696* (2013.01); *H01L 29/42368* (2013.01)

(58) Field of Classification Search
CPC .................................................. H01L 29/7816
USPC ......................................................... 257/339
See application file for complete search history.

(56) References Cited

U.S. PATENT DOCUMENTS

2013/0105909 A1* 5/2013 Hu ................... H01L 21/823814
257/369
2018/0331211 A1* 11/2018 Huang ................ H01L 29/0653

* cited by examiner

*Primary Examiner* — Jami Valentine Miller
(74) *Attorney, Agent, or Firm* — Tung & Associates

(57) ABSTRACT

A high voltage MOS device includes: a well, a body region, a gate, a source, plural body contact regions and a drain. The plural body contact regions are formed in the body region, wherein each of the body contact region is located beneath the top surface and contacts the top surface in the vertical direction, and is in contact or not in contact with the gate in the lateral direction. The plural body contact regions are arranged substantially in parallel in the width direction and any two neighboring body contact regions are not in contact with each other in the width direction. The gate includes a poly-silicon layer which serves as the only electrical contact of the gate, and every part of the poly-silicon layer is the first conductivity type.

18 Claims, 19 Drawing Sheets

HIGH VOLTAGE METAL OXIDE SEMICONDUCTOR DEVICE AND MANUFACTURING METHOD THEREOF

CROSS REFERENCE

The present invention claims priority to TW 106135368, filed on Oct. 16, 2017.

BACKGROUND OF THE INVENTION

Field of Invention

The present invention relates to a high voltage metal oxide semiconductor (MOS) device and manufacturing method thereof; particularly, it relates to such a high voltage MOS device having plural body contact regions, and a manufacturing method thereof.

Description of Related Art

FIGS. 1A and 1B show schematic diagrams of a top view and a cross-sectional view respectively of prior art high voltage MOS devices (an N-type high voltage MOS device 1 and an N-type high voltage MOS device 1'). As shown in FIGS. 1A and 1B, the high voltage MOS device 1 and the high voltage MOS device 1' are mirror-arranged and formed in the semiconductor substrate 11. The semiconductor substrate 11 has a top surface 11' and a bottom surface 11". Each of the high voltage MOS device 1 and the high voltage MOS device 1' includes: an N-type well 12, a gate 13, an N-type source 14, a P-type body region 16, an N-type drain 17 and a P-type body contact region 18. The N-type source 14 is formed in the P-type body region 16. The body contact region 18 in the P-type body region 16 serves as an electrical contact of the P-type body region 16. In general, as shown in FIG. 1A, the N-type source 14 and the P-type body contact region 18 are arranged in parallel in a lateral direction, wherein the N-type source 14 is in contact with the gate 13 in the lateral direction, and the P-type body contact region 18 is not in contact with the gate 13 in the lateral direction. The high voltage MOS device 1 and the high voltage MOS device 1' share the same body contact region 18 by mirror-arrangement in the lateral direction, so as to reduce the overall device size. The high voltage MOS device 1 has a unit pitch d1, which is a length of the high voltage MOS device 1 in the lateral direction. The unit pitch d1 is a parameter for calculating the overall device size when there are plural mirror-arranged high voltage MOS devices 1 and 1'.

FIGS. 2A and 2B show schematic diagrams of a top view and a cross-sectional view respectively of another prior art high voltage MOS devices (an N-type high voltage MOS device 2 and an N-type high voltage MOS device 2'). As shown in FIGS. 2A and 2B, the high voltage MOS device 2 and the high voltage MOS device 2' are mirror-arranged and formed in the semiconductor substrate 11. The semiconductor substrate 11 has a top surface 11' and a bottom surface 11". Each of the high voltage MOS device 2 and the high voltage MOS device 2' includes: an N-type well 12, a gate 23, N-type sources 24, a P-type body region 16, an N-type drain 17 and P-type body contact regions 28. The N-type source 24 is formed in the P-type body region 16. The body contact region 28 in the P-type body region 16 serves as an electrical contact of the P-type body region 16.

The high voltage MOS device 2 and the high voltage MOS device 2' are different from the high voltage MOS device 1 and the high voltage MOS device 1' shown in FIGS. 1A and 1B in that, as shown in FIG. 2A, the plural N-type sources 24 and the plural P-type body contact regions 28 are arranged in parallel in the width direction; and the gate 23 includes plural N-type gate regions 23' and plural P-type gate regions 23", wherein the plural N-type gate regions 23' and the P-type gate regions 23" are arranged in parallel and alternatingly in the width direction and are laterally in contact with the corresponding plural N-type sources 24 and the plural P-type body contact regions 28. Different from the high voltage MOS device 1 and the high voltage MOS device 1', which are mirror-arranged in the lateral direction, and share the same body contact region 18, the high voltage MOS device 2 and the high voltage MOS device 2' are mirror-arranged in the lateral direction and share the same sources 24 and the body contact regions 28, to reduce the overall component size.

Comparing the unit pitch d1 of the high voltage MOS device 1 with a unit pitch d2 of the high voltage MOS device 2 excluding a common length from the gate 13 and 23 to the drain 17, the unit pitch d1 of the high voltage MOS device 1 includes a whole length of the source 14 and a half-length of the body contact region 18 in the lateral direction, that is, the pitch d1', while the unit pith d2 of the high voltage MOS device 2 only includes a half-length of the source 24, i.e., the pitch d2', (note that the lateral size occupied by the source 24 and the body contact region 28 is smaller than the lateral size occupied by the source 14 and the body contact region 18); the pitch d2' is approximately one-third of the pitch d1', so the high voltage MOS devices 2 and the high voltage MOS device 2' shown in FIGS. 2A and 2B are significantly smaller than the high voltage MOS device 1 shown in FIGS. 1A and 1B in the lateral direction, to further reduce the overall component size.

However, the prior art shown in FIGS. 2A and 2B has a disadvantage. When the body contact region 28 is formed by ion implantation, the region defined for the implantation contains the P-type gate region 23" because, in the prior art, the gate 23 is used as a self-aligned mask for the body contact region 28. However, as a result, P-type impurities are implanted into the gate 23 to form the P-type gate region 23". In an ON operation of the high voltage MOS device, the channel region under the N-type gate region 23' is turned on (as shown in FIG. 2D), but the channel region under the P-type gate region 23" is not turned on (as shown in FIG. 2E). Therefore, the conductive resistances of the high voltage MOS region 2 and the high voltage MOS region 2' are increased.

In view of above, to overcome the drawbacks in the prior art, the present invention proposes a high voltage MOS device and a method of manufacturing the same.

SUMMARY OF THE INVENTION

In one perspective, the present invention provides a high voltage metal oxide semiconductor (MOS) device, which is formed in a semiconductor substrate, wherein the semiconductor substrate has a top surface and a bottom surface opposite to the top surface in a vertical direction. The high voltage MOS device includes: a well with a first conductivity type, which is formed in the semiconductor substrate, and is located beneath the top surface and contacts the top surface in the vertical direction; a body region with a second conductivity type, which is formed in the well, and is located beneath the top surface and contacts the top surface in the vertical direction; a gate, which is formed on the top surface, wherein part of the gate stacks on and contacts right above part of the body region in the vertical direction; a source with the first conductivity type, which is formed in the body region, and is located beneath the top surface and contacts the top surface in the vertical direction, and the source is in contact with a first side of the gate in a lateral direction; a plurality of body contact regions, which have the second conductivity type, and are formed in the body region, wherein each of the plural body contact regions is located beneath the top surface and contacts the top surface in the vertical direction, and is in contact or not in contact with the first side of the gate in the lateral direction, wherein the plural body contact regions are arranged substantially in parallel in a width direction and any two neighboring body connecting regions are at least partially separated from each other in the width direction; and a drain with the first conductivity type, which is formed in the well and is located beneath the top surface and contacts the top surface in the vertical direction, and the drain is located outside a second side of the gate, wherein the source and the drain are separated by the body region and the well; wherein the gate includes a poly-silicon layer serving as an electrical contact of the gate, and all the poly-silicon layer has the first conductivity type.

In one preferable embodiment, the high voltage MOS device further includes a field oxide region, which is formed on the top surface, and stacks on and contacts right above part of the well, wherein part of the gate which is near the drain, including the second side of the gate, stacks on and contacts right above at least part of the field oxide region.

In one preferable embodiment, the plural body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

In one preferable embodiment, the plural body contact regions are not in contact with the first side of the gate in the lateral direction, and each of the body contact region is apart from the first side of the gate by at least a predetermined distance.

In one preferable embodiment, the predetermined distance is not less than 0.05 micrometers.

In one perspective, the present invention provides a manufacturing method of a high voltage metal oxide semiconductor (MOS) device. The manufacturing method includes: providing a semiconductor substrate which has a top surface and a bottom surface opposite to the top surface in a vertical direction; forming a well with a first conductivity type in the semiconductor substrate, wherein the well is located beneath the top surface and contacts the top surface in the vertical direction; forming a body region with a second conductivity type in the well, wherein the body region is located beneath the top surface and contacts the top surface in the vertical direction; forming a gate on the top surface, wherein part of the gate stacks on and contacts right above part of the body region in the vertical direction; forming a source with the first conductivity type in the body region, wherein the source is located beneath the top surface and contacts the top surface in the vertical direction, and the source is in contact with a first side of the gate in a lateral direction; forming a plurality of body contact regions with the second conductivity type in the body region, wherein each of the plural body contact regions is located beneath the top surface and contacts the top surface in the vertical direction, and is in contact or not in contact with the first side of the gate in the lateral direction, wherein the plural body contact regions are arranged substantially in parallel in a width direction and any two neighboring body contact regions are at least partially separated from each other in the width direction, and forming a drain with the first conductivity type in the well, wherein the drain is located beneath the top surface and contacts the top surface in the vertical direction, and the drain is located outside a second side of the gate, wherein the source and the drain are separated by the body region and the well; wherein the gate includes a poly-silicon layer which serves as an electrical contact of the gate, and all the poly-silicon layer has the first conductivity type.

In one preferable embodiment, the manufacturing method further includes: forming a field oxide region on the top surface, wherein the field oxide region stacks on and contacts right above part of the well, wherein part of the gate which is near the drain, including the second side of the gate, stacks on and contacts right above at least part of the field oxide region.

In one preferable embodiment, the plural body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

In one preferable embodiment, the plural body contact regions are not in contact with the first side of the gate in the lateral direction, and each of the body contact region is apart from the first side of the gate by at least a predetermined distance.

In one preferable embodiment, the predetermined distance is not less than 0.05 micrometer.

In one preferable embodiment, the step of forming the gate includes: implanting first conductivity type impurities in the poly-silicon layer in a form of accelerated ion beam by a first ion implantation process step which is a same process step of forming the source and/or the drain; and forming a photoresist layer to mask the gate so that the second conductivity type impurities are not implanted into the poly-silicon layer in a second ion implantation process step which is a same process step of forming the plural body contact regions.

In one preferable embodiment, the step of forming the gate includes: implanting first conductivity type impurities in the poly-silicon layer in a form of accelerated ion beam with a first ion implantation process step which is a same process step of forming the source and/or the drain; and implanting the first conductivity type impurities in the poly-silicon layer in the form of accelerated ion beam by a second ion implantation process step to convert a region of the poly-silicon layer having the second conductivity type to the first conductivity type so that every part of the poly-silicon layer has the first conductivity type.

The objectives, technical details, features, and effects of the present invention will be better understood with regard to the detailed description of the embodiments below.

DESCRIPTION OF THE PREFERRED EMBODIMENTS

The present invention are for illustration only, to show the interrelations between the regions and the process steps, but not drawn according to actual scale.

Figure 1A:
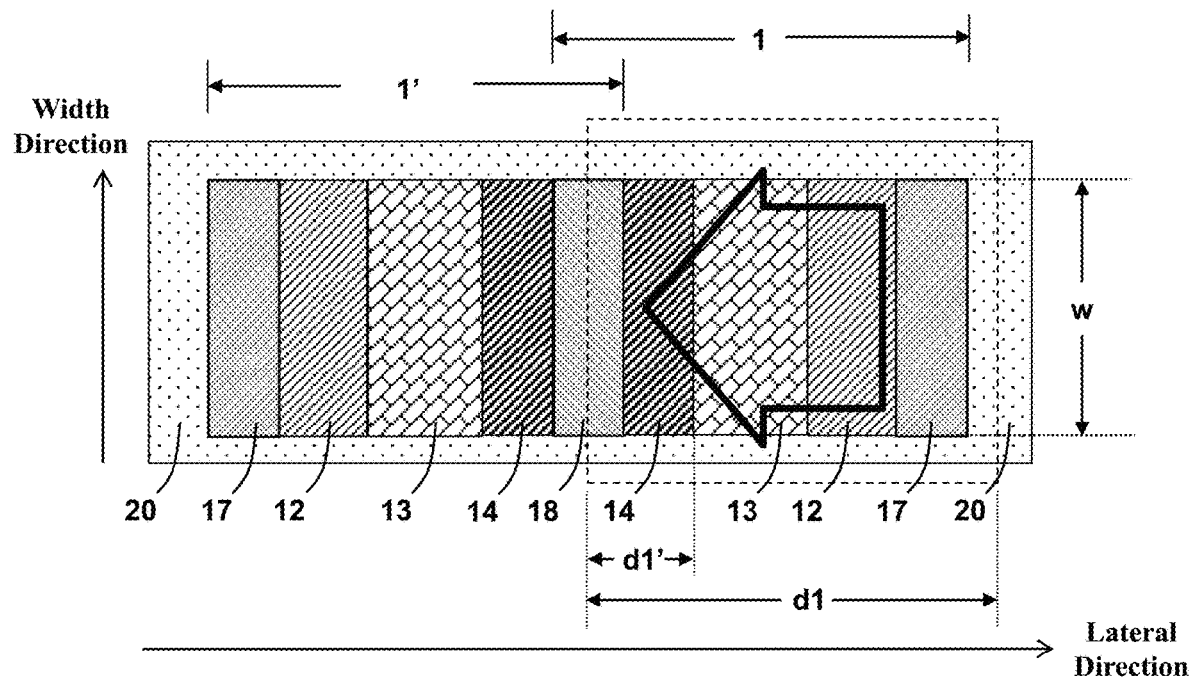
FIGS. 1A and 1B show schematic diagrams of a top view and a cross-sectional view respectively of prior art high voltage MOS devices.
Figure 1B:
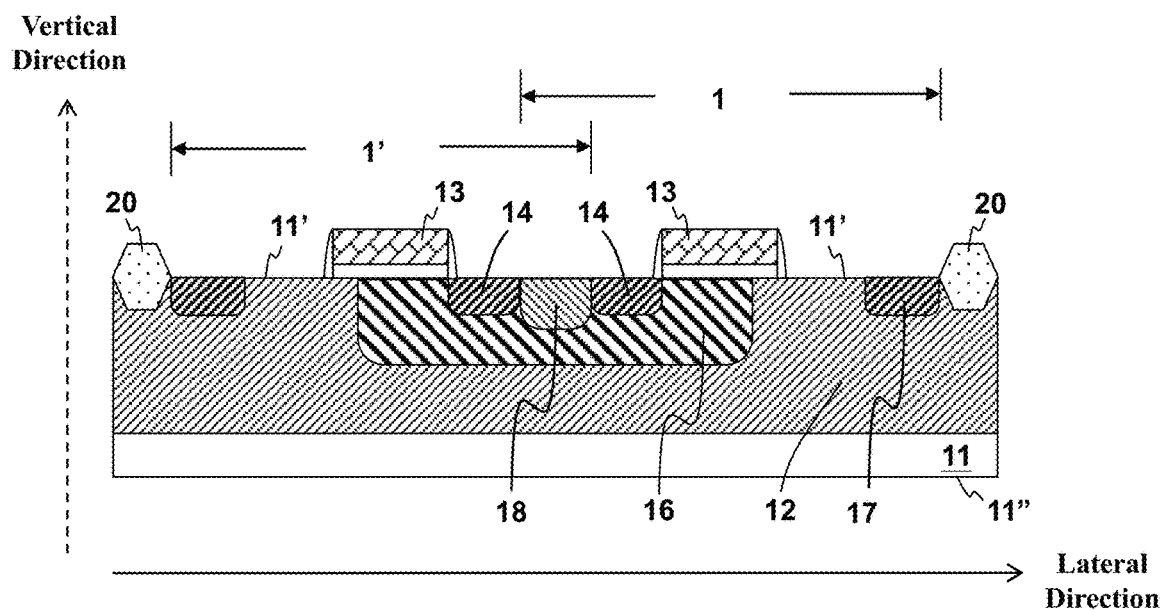
Figure 2A:
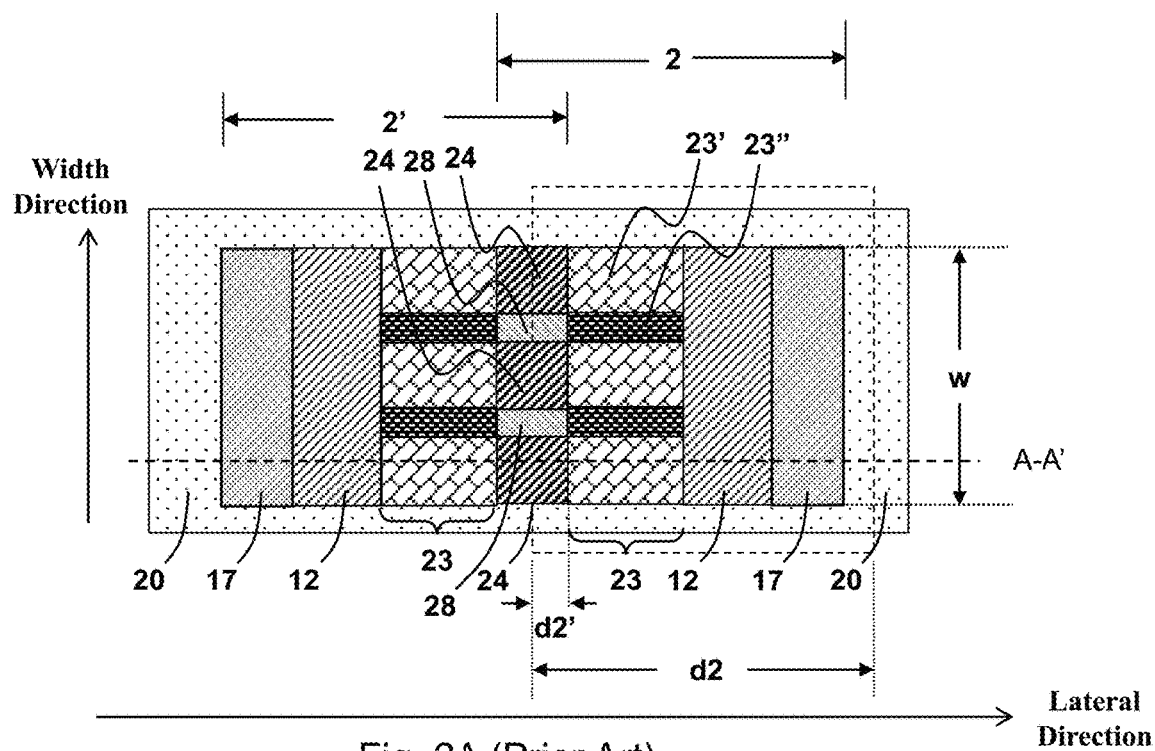
FIGS. 2A-2E show schematic diagrams of top views and cross-sectional views of another prior art high voltage MOS devices.
Figure 2B:
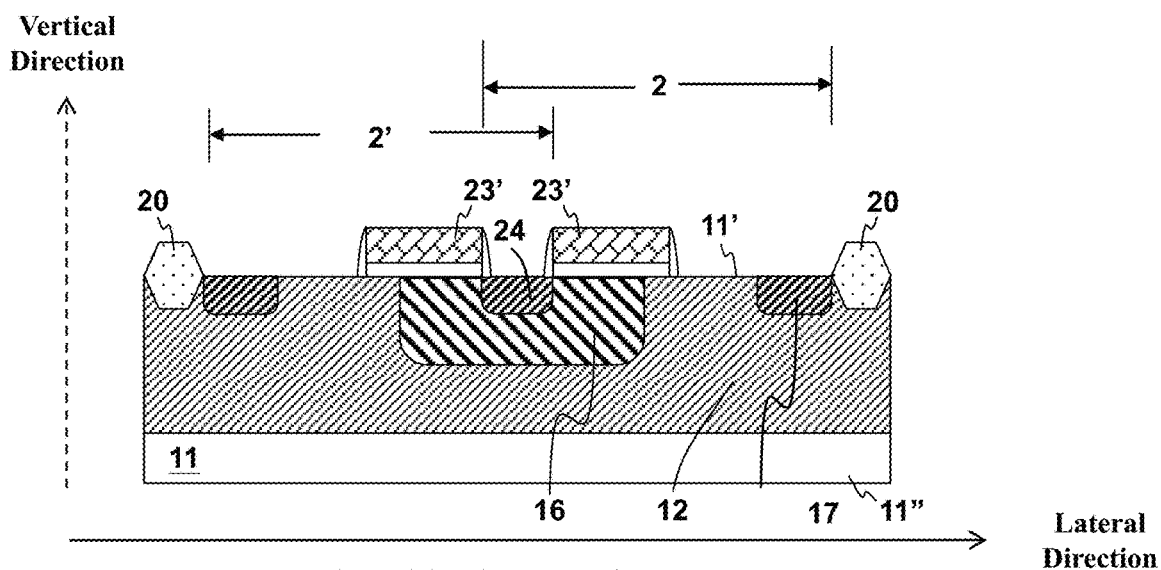
Figure 2C:
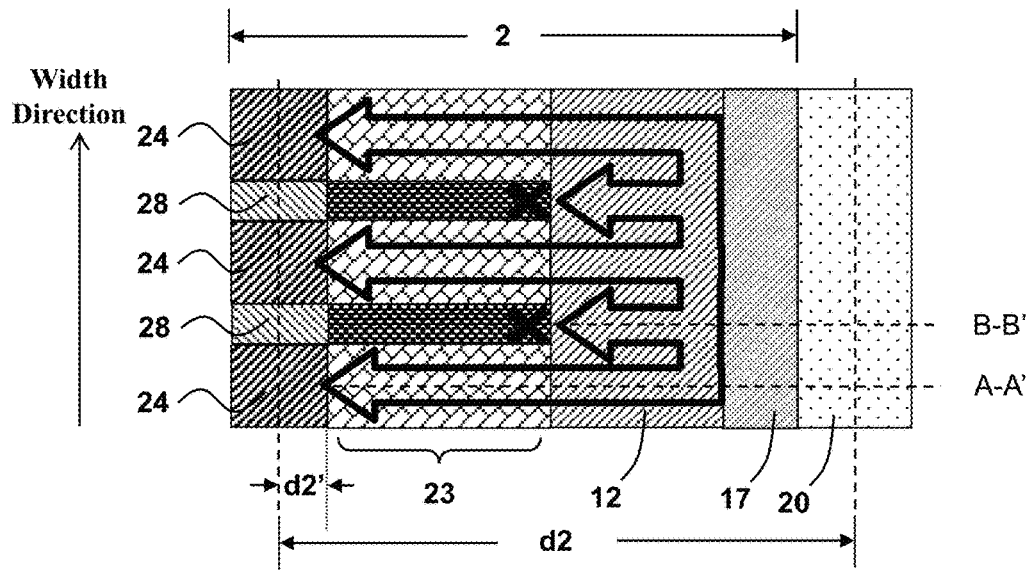
Figure 2D:
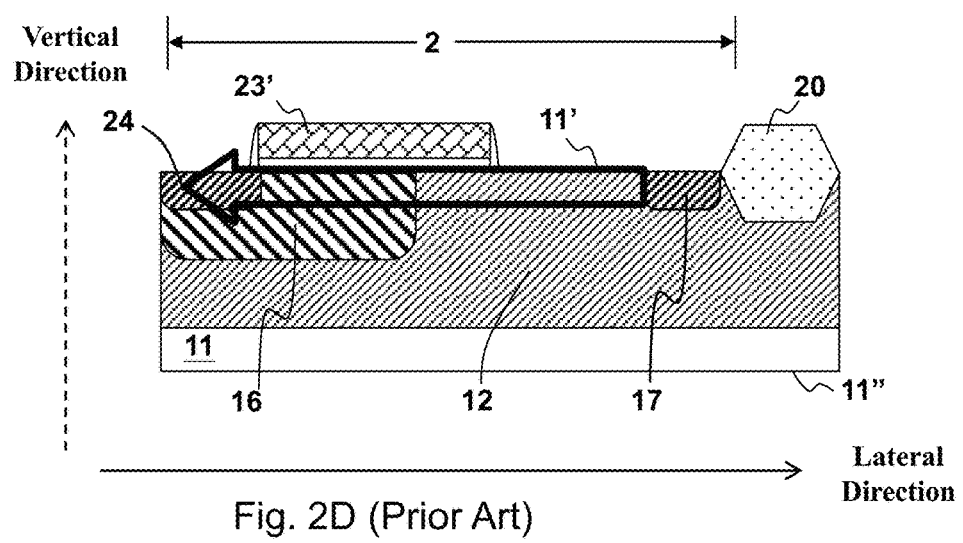
Figure 2E:
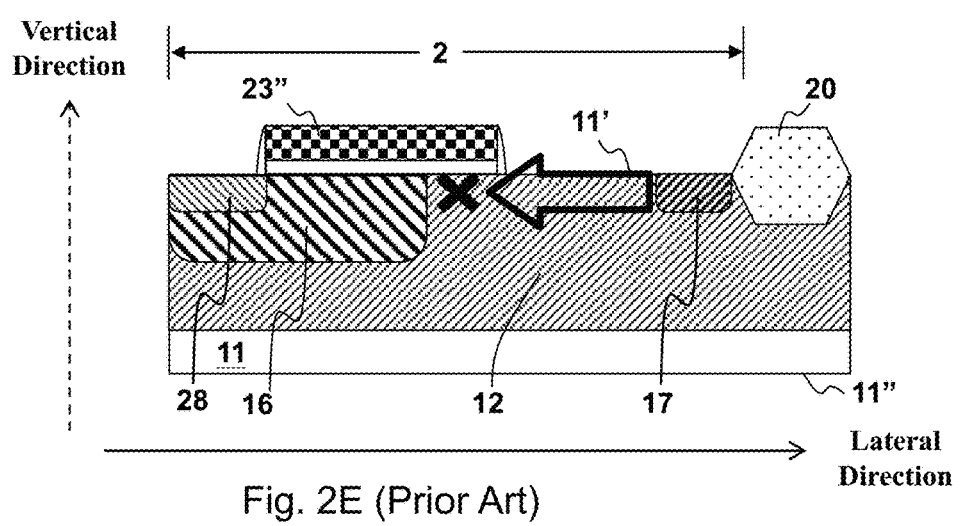
Figure 3A:
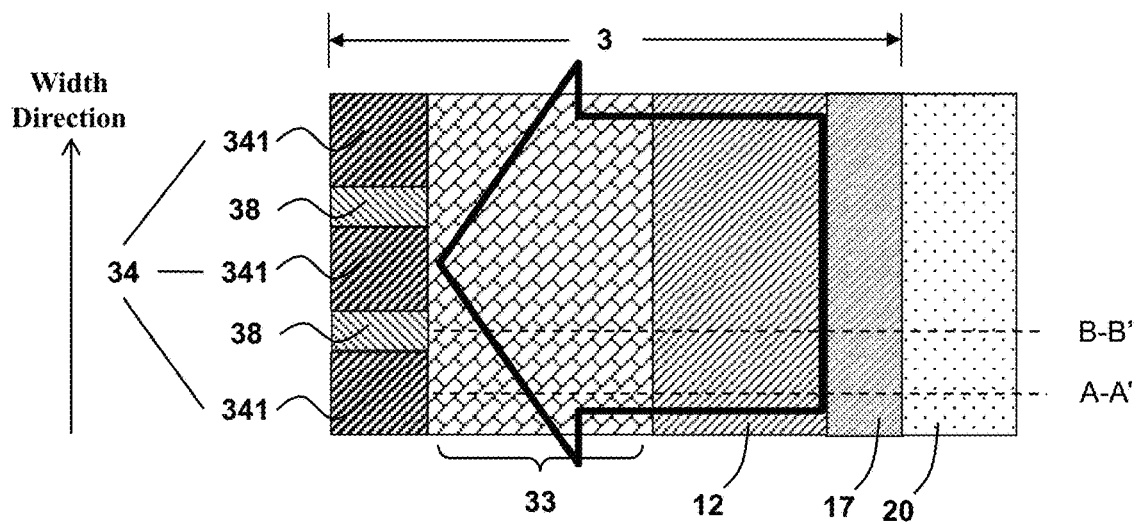
FIGS. 3A-3C show a first embodiment of the present invention.
Figure 3B:
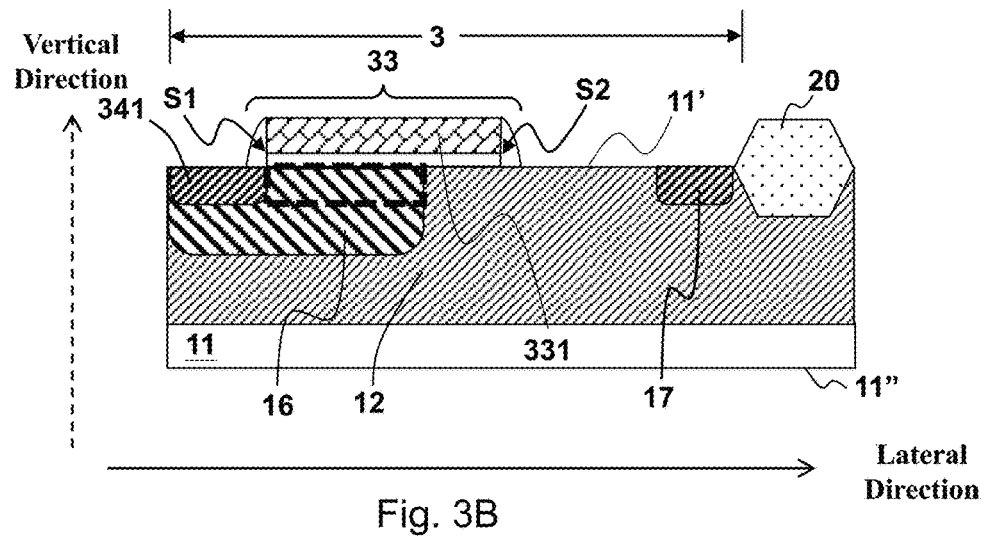
Figure 3C:
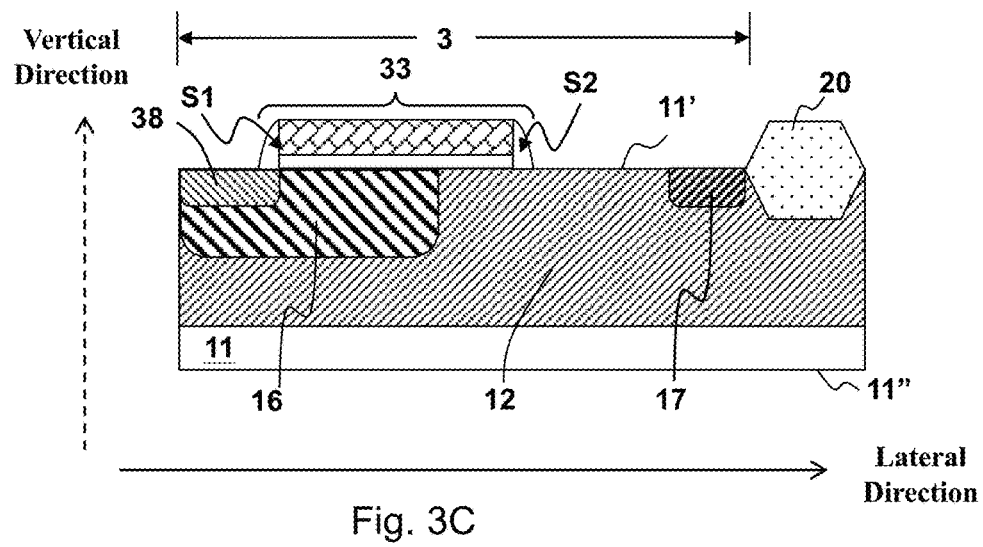

Please refer to FIGS. 3A, 3B and 3C for a first embodiment according to the present invention. FIGS. 3A, 3B and 3C show schematic diagrams of a top view, a first cross-sectional view (corresponding to the cross-section line A-A' of the top view FIG. 3A) and a second cross-sectional view (corresponding to the cross-section line B-B' of the top view FIG. 3A) respectively of a high voltage MOS device 3 according to the present invention. As shown in FIGS. 3A, 3B and 3C, the high voltage MOS device 3 is formed in the semiconductor substrate 11, wherein the semiconductor substrate 11 has a top surface 11' and a bottom surface 11" opposite to the top surface 11' in the vertical direction (as indicated by dashed arrows shown in FIG. 3B and FIG. 3C). The high voltage MOS device 3 includes: a well 12, a body region 16, a drain 17, a gate 33, a source 34 (including plural source sub-regions 341), and plural body contact regions 38.

Still referring to FIGS. 3A, 3B and 3C, the well 12 with the first conductivity type is formed in the semiconductor substrate 11, and is located beneath the top surface 11' and contacts the top surface 11' in the vertical direction. The body region 16 with a second conductivity type is formed in the well 12 and is located beneath the top surface 11' and contact the top surface 11' in the vertical direction. The gate 33 is formed on the top surface 11'. Part of the gate 33 stacks on and contacts right above part of the body region 16 in the vertical direction. Note that, the channel region (as indicated by a dashed frame shown in FIG. 3B) of the high voltage MOS device 3 is a part of the body region 16 under the gate 33 an overlap region of a vertical projection of the gate 33 in the vertical direction and the. The gate 33 in this specification refers to a structure including a gate conductive layer on top, a gate dielectric layer under conductive layer and contacting the top surface 11', and a spacer layer at two sides of the gate conductive layer and the gate dielectric layer, as well known by those skilled in the art, so details thereof are omitted here.

Still referring FIGS. 3A, 3B and 3C, the source 34 with the first conductivity type is formed in the body region 16. The source 34 is located beneath the top surface 11' and contacts the top surface 11' in the vertical direction. The source 34 is in contact with a first side S1 of the gate 33 in the lateral direction (as indicated by solid arrows shown in FIG. 3B or 3C, and same hereinafter). The plural body contact regions 38 with the second conductivity type are all formed in the body regions 16. Each of the body contact regions 38 is located beneath the top surface 11' and contacts the top surface 11' in the vertical direction. In this embodiment, each of the body contact regions 38 is in contact with the first side S1 of the gate 33 in the lateral direction. The plural body contact regions 38 are arranged substantially in parallel in a width direction (as indicated by a solid arrow shown in FIG. 3A, and same hereinafter), and any two neighboring body contact regions 38 are at least partially separated from each other in the width direction. In the embodiment of FIG. 3A, any two neighboring body connecting regions 38 do not contact each other in the width direction. In this embodiment, the plural body contact regions 38 separate the source 34 into plural source sub-regions 341. The plural source sub-regions 341 are in contact with the first side S1 of the gate 13 in the lateral direction, and the plural source sub-regions 341 are arranged substantially in parallel in the width direction; any two neighboring source sub-regions 341 do not contact each other in the width direction. The drain 17 with the first conductivity type is formed in the well 12 and is located beneath the top surface 11' and contacts the top surface 11' in the vertical direction. The drain 17 is located outside a second side S2 of the gate 33, and is separated from the source 34 by the body region 16 and the well 12.

Note that, the aforementioned regions with the first conductivity type and the second conductivity type indicate semiconductor regions in the high voltage MOS device which are doped with impurities (for example but not limited to the aforementioned well, body region, body contact region, source, and drain, etc.), so that the semiconductor regions present conductivities of the first conductivity type and the second conductivity type, wherein the first conductivity type for example may be N-type and the second conductivity type may be P-type, or the opposite.

Note that, In the context of the present invention, the "high voltage MOS device" refers to a MOS device which is capable of withstanding a voltage over 5V on a drain thereof in normal operation. In this embodiment, the high voltage MOS device 3 includes the well 12 which separates the drain 17 and the channel region. A length in the lateral direction between the body region 16 and the drain 17 (a drift region length) may be determined according to the operation voltage required in normal operation. The drift region length should be longer when the high voltage MOS device 3 needs to sustain a relatively higher operation voltage. The channel region is a region which is determined to be conductive or non-conductive by a voltage applied on the gate, and the drift region length may be determined according to the operation voltage that the device is designed for, as well known by those skilled in the art, so details thereof are omitted here.

Note that, one feature of the present invention which is advantageous over the prior art is that, referring to the embodiment shown in FIGS. 3A, 3B and 3C, when the plural body contact regions 38 are formed, the regions which are defined for implantation do not include any part of the gate 33. In contrast to the present invention, the prior art high voltage MOS device 2 uses the gate 23 as a self-aligned mask, and thus P-type impurities are implanted into the gate 23 to form the P-type gate region 23" when the plural body contact regions 28 are formed. In this embodiment of the present invention, the poly-silicon layer serves as the electrical contact of the gate 33, and every portion of the entire poly-silicon layer is the first conductivity type without any second conductivity type impurities. The high voltage MOS device 3 of the present invention has a significantly lower conductive resistance than that of the high voltage MOS device 2 of the prior art in ON operation. Note that the field oxide region 20' is not limited to the local oxidation of silicon (LOCOS) structure as shown in the figure, but also may be a shallow trench isolation (STI) structure.

Figure 4A:
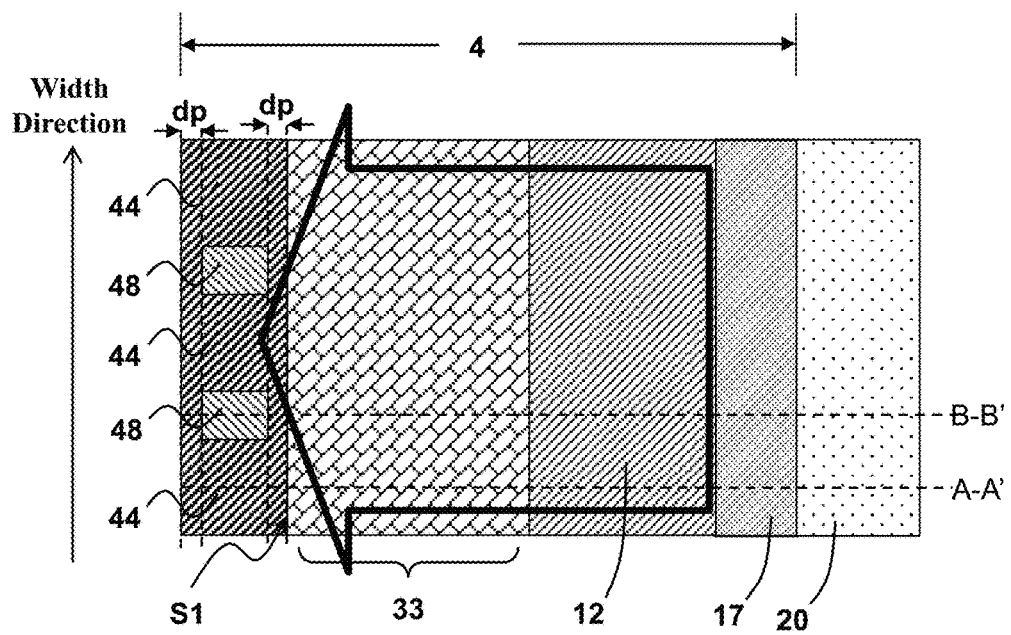
FIGS. 4A-4C show a second embodiment of the present invention.
Figure 4B:
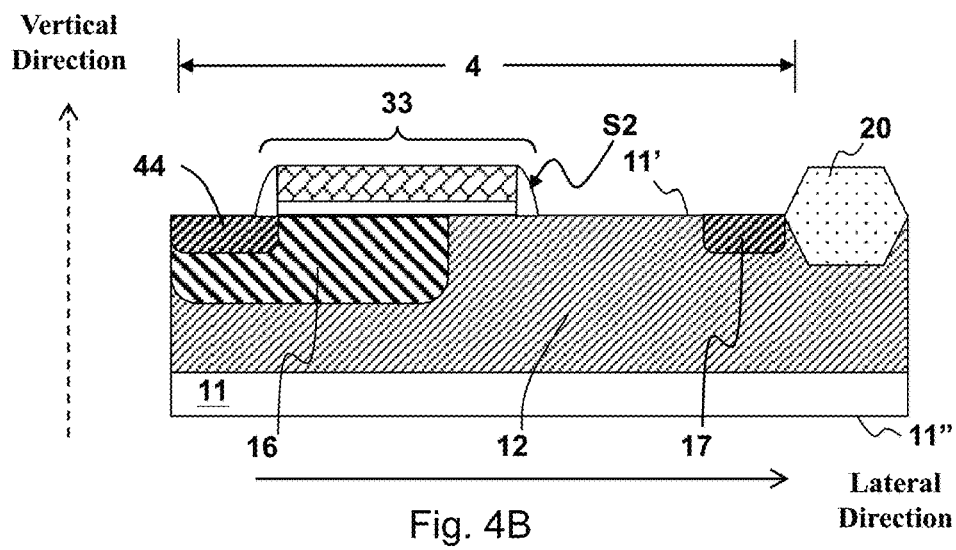
Figure 4C:
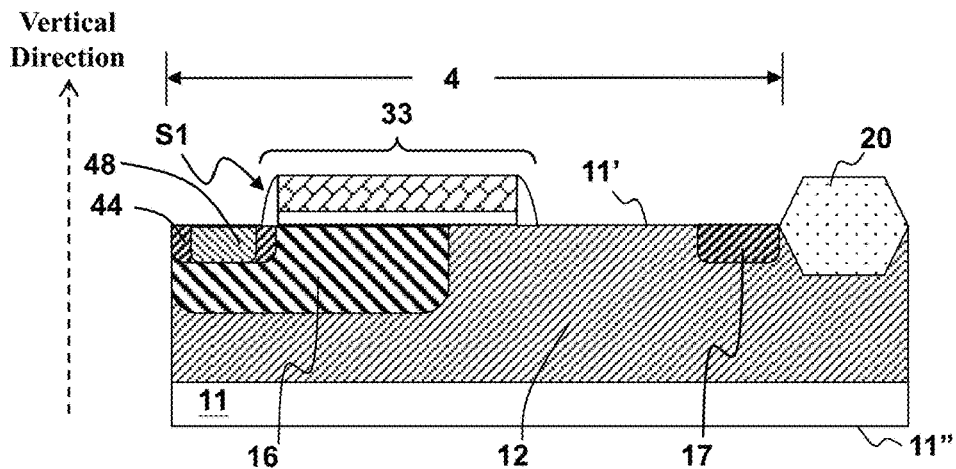

Please refer to FIGS. 4A-4C for a second embodiment according to the present invention. FIGS. 4A, 4B and 4C show schematic diagrams of a top view, a first cross-sectional view (corresponding to the cross-section line A-A' of the top view FIG. 4A) and a second cross-sectional view (corresponding to the cross-section line B-B' of the top view FIG. 4A) respectively of a high voltage MOS device 4 according to the present invention. The high voltage MOS device 4 is similar to the high voltage MOS deice 3. This embodiment is different from the first embodiment in that, in this embodiment, the plural body contact regions 48 of the high voltage MOS device 4 are not in contact with the first side S1 of the gate 33 in the lateral direction, and each of the body contact region 48 is apart from the first side S1 of the gate 33 by at least a predetermined distance dp in the lateral direction. In this embodiment, the source 44 is a complete and continuous region and is not separated to plural source sub-regions.

In one embodiment, the predetermined distance dp is preferably not less than 0.05 micrometer, to tolerate manufacture errors. In one preferable embodiment, the predetermined distance dp is 0.1 micron.

Figure 5A:
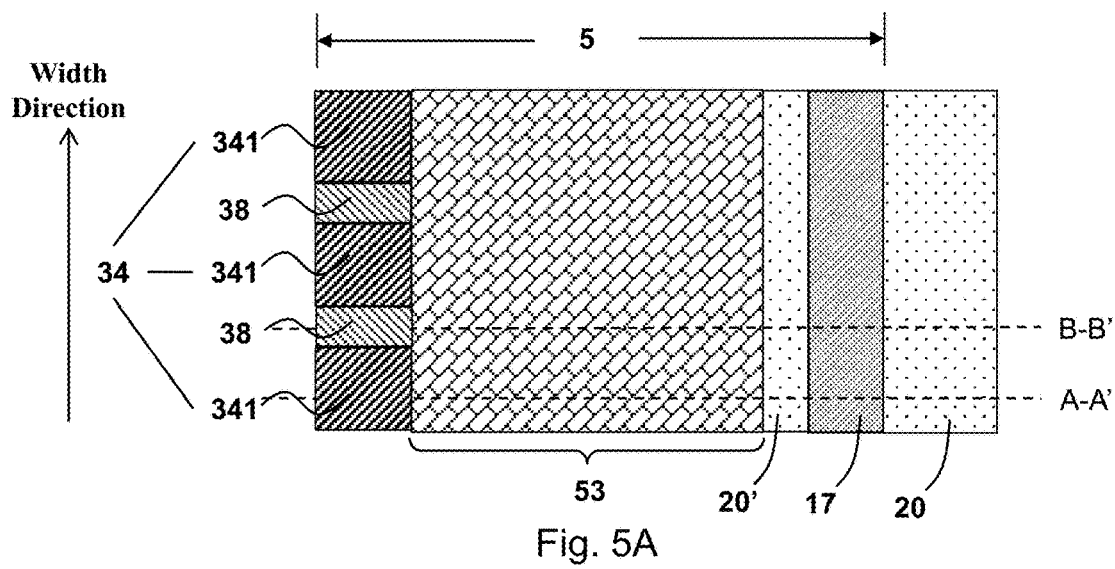
FIGS. 5A-5C show a third embodiment of the present invention.
Figure 5B:
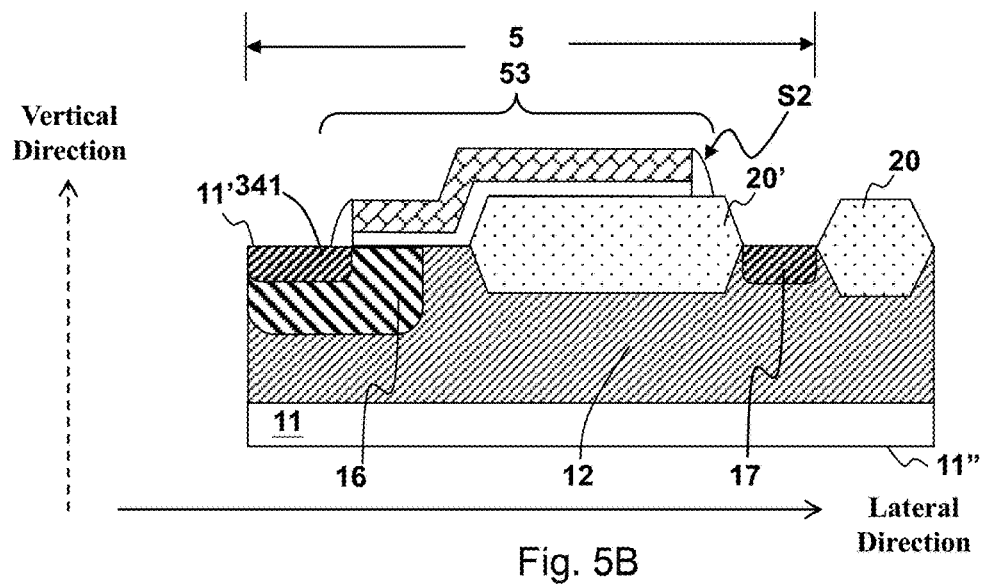
Figure 5C:
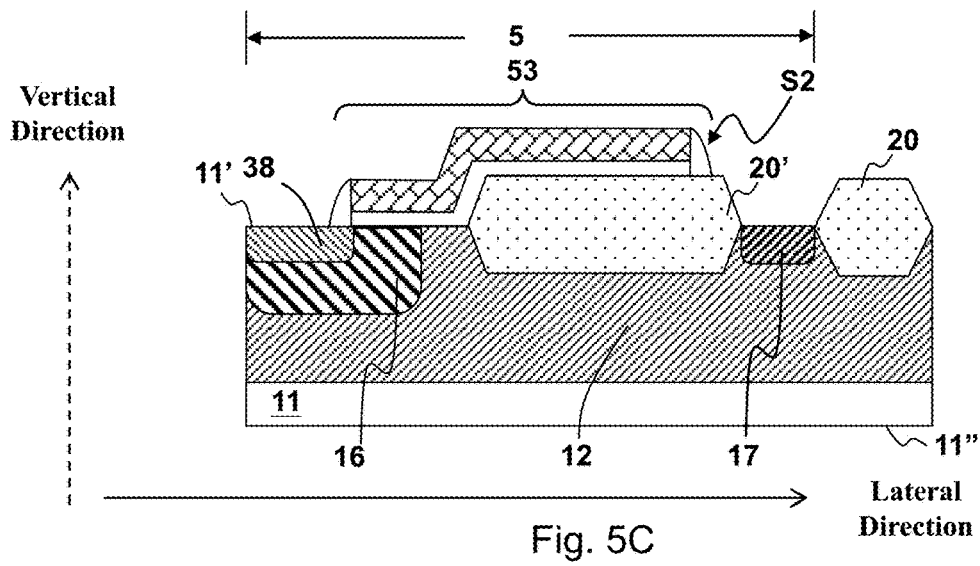

FIGS. 5A-5C show a third embodiment of the present invention. FIGS. 5A, 5B and 5C show schematic diagrams of a top view, a first cross-sectional view (corresponding to the cross-section line A-A' shown in the top view FIG. 5A), and a second cross-sectional view (corresponding to the cross-section line B-B' shown in the top view FIG. 5A) of a high voltage MOS device 5 according to the present invention. The high voltage MOS device 5 is similar to the aforementioned high voltage MOS device 3, but is different in that: in this embodiment, the high voltage MOS device 5 further includes a field oxide region 20' which is formed on the top surface 11' and stacks on and contacts right above part of the well 12. Part of the gate 53 near the drain 17, including a second side S2 of the gate 53, stacks on and contacts right above at least part of the field oxide region 20'.

Figure 6A:
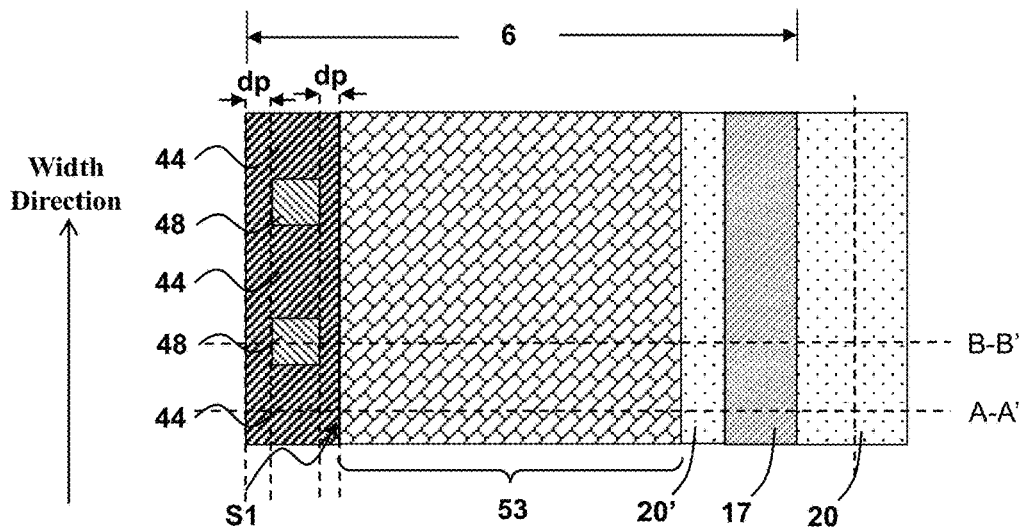
FIGS. 6A-6C show a fourth embodiment of the present invention.
Figure 6B:
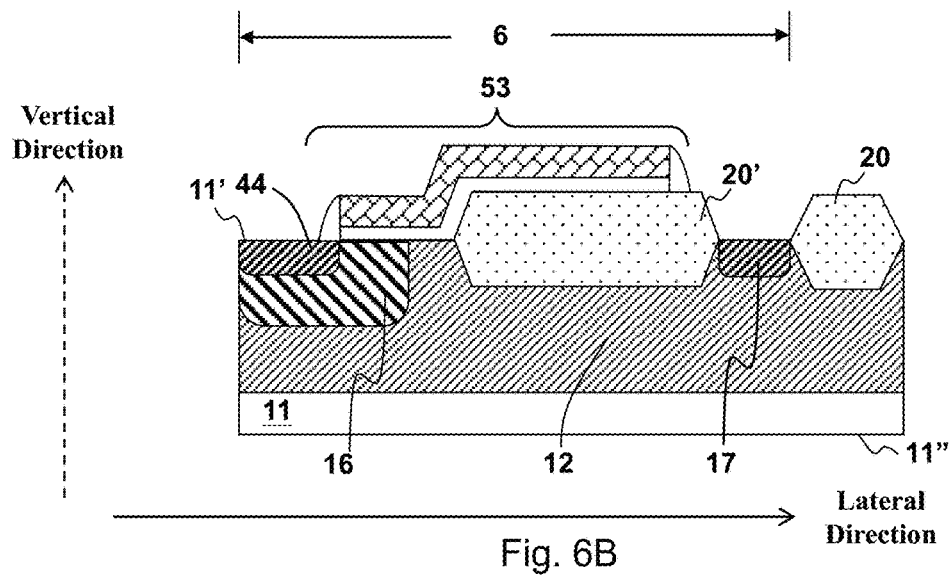
Figure 6C:
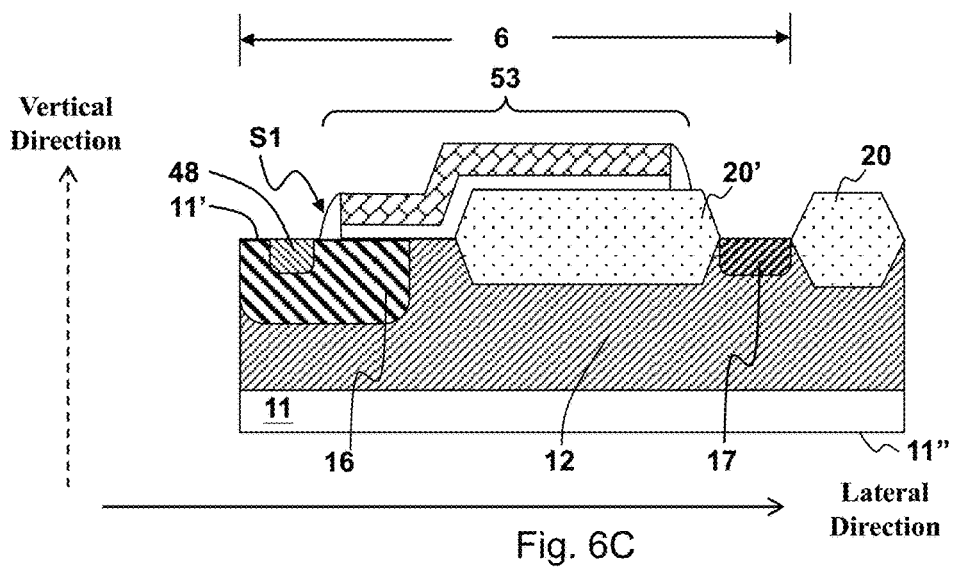

Please refer to FIGS. 6A-6C for a fourth embodiment according to the present invention. FIGS. 6A, 6B and 6C show schematic diagrams of a top view, a first cross-sectional view (corresponding to the cross-section line A-A' of the top view FIG. 6A) and a second cross-sectional view (corresponding to the cross-section line B-B' of the top view FIG. 6A) respectively of a high voltage MOS device 6 according to the present invention. The high voltage MOS device 6 is similar to the high voltage MOS deice 5. This embodiment is different from the third embodiment in that, in this embodiment, the plural body contact regions 48 of the high voltage MOS device 6 are not in contact with the first side S1 of the gate 53 in the lateral direction, and each of the body contact region 48 is apart from the first side S1 of the gate 53 by at least a predetermined distance dp in the lateral direction. In this embodiment, the source 44 is a complete and continuous region and is not separated to plural source sub-regions.

Figure 7A:
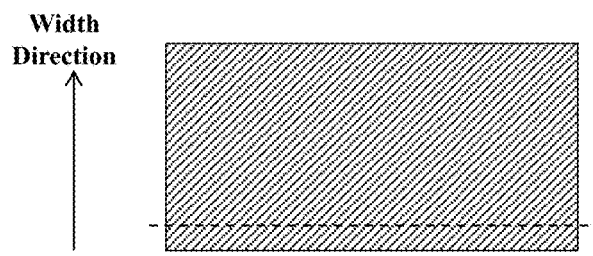
FIGS. 7A-7N show a fifth embodiment of the present invention.
Figure 7B:
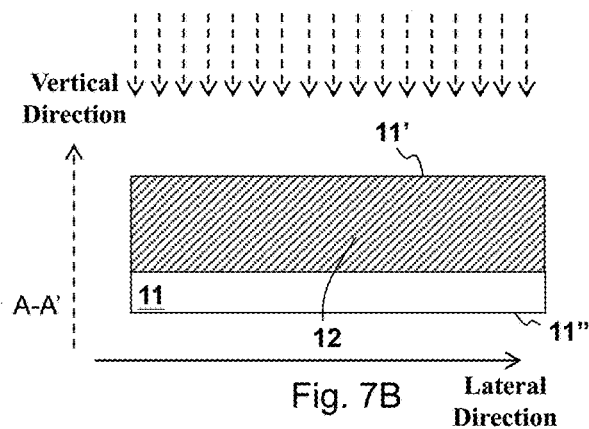
Figure 7C:
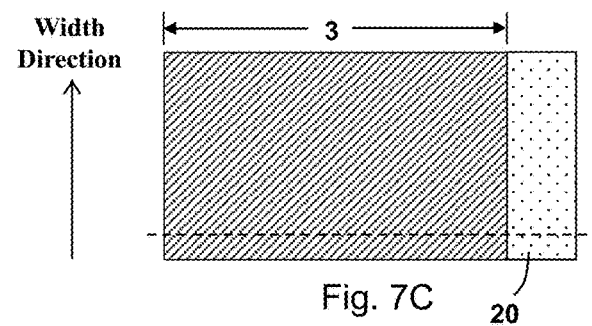
Figure 7D:
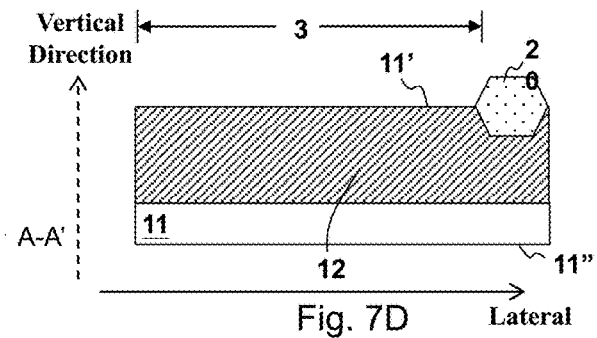
Figure 7E:
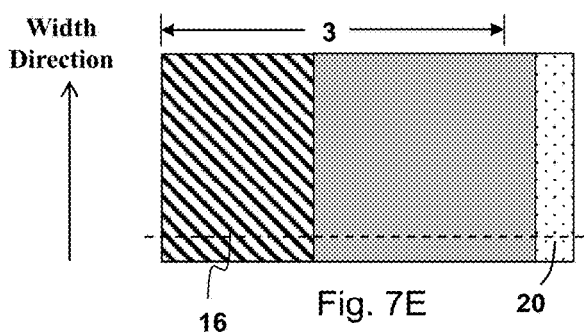
Figure 7F:
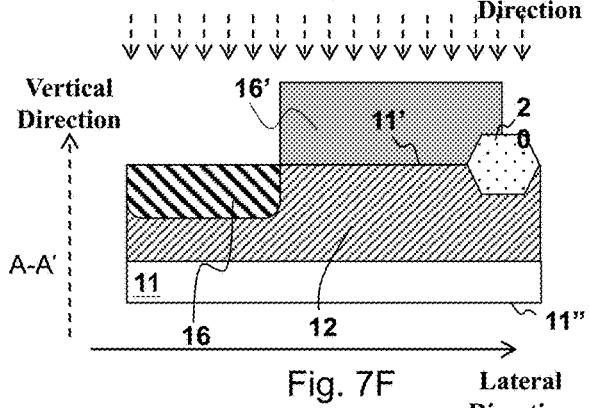
Figure 7G:
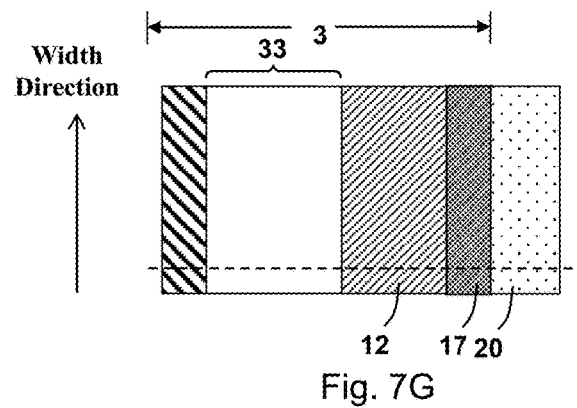
Figure 7H:
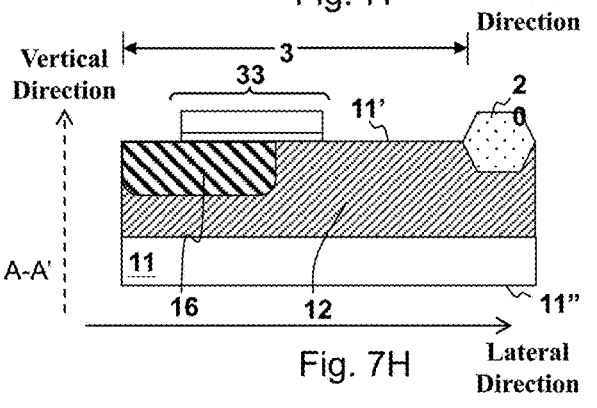
Figure 7I:
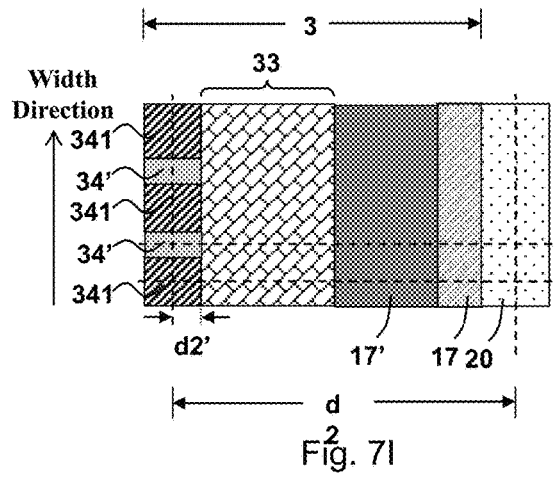
Figure 7J:
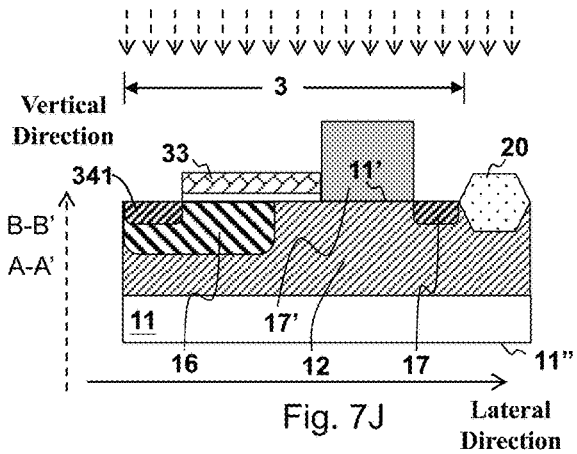
Figure 7K:
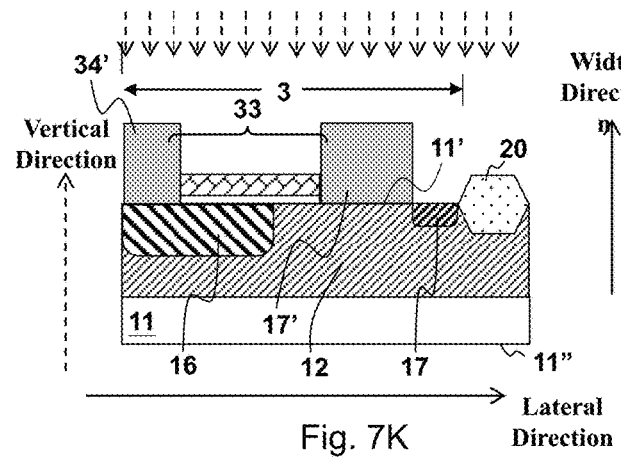
Figure 7L:
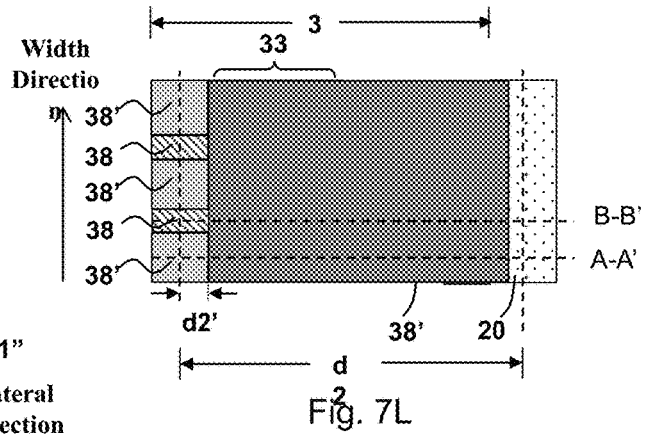
Figure 7M:
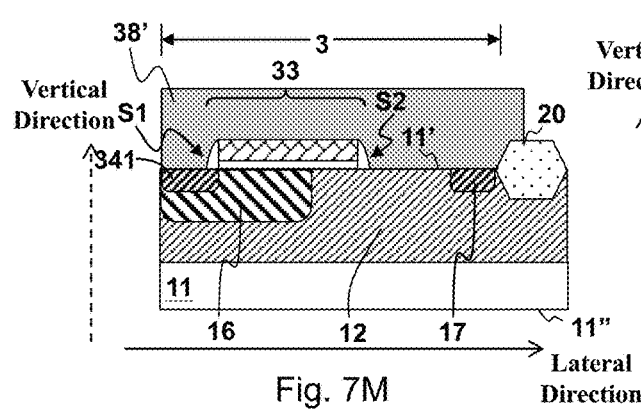
Figure 7N:
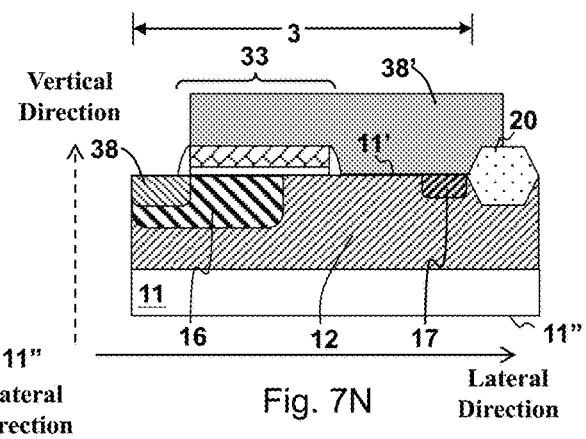

Please refer to FIGS. 7A-7N for a fifth embodiment of the present invention. This embodiment shows a manufacturing method of the high voltage MOS device according to the present invention. This embodiment shows a manufacturing method, taking the high voltage MOS device 3 in the first embodiment as an example. First, as shown in the top view FIG. 7A and the cross-sectional view FIG. 7B (corresponding to the cross-section line A-A' shown in the top view FIG. 7A), a semiconductor substrate 11 is provided, wherein the semiconductor substrate 11 is for example but not limit to a P-type silicon substrate, and the semiconductor substrate 11 may be another semiconductor substrate. The semiconductor substrate 11 has a top surface 11' and a bottom surface 11" opposite to the top surface 11' in the vertical direction (as indicated by dashed arrows shown in FIG. 7B). Next, as shown in FIGS. 7A and 7B, a well 12 with the first conductivity type is formed in the semiconductor substrate 11, wherein the well 12 is located beneath the top surface 11' and contacts the top surface 11' in the vertical direction. The well 12 with the first conductivity type for example may be formed by processes including a lithography process, an ion implantation process and a thermal process, as well known by those skilled in the art, so details thereof are omitted here.

Next, as shown in the top view FIG. 7C and the cross-sectional view FIG. 7D (corresponding to the cross-section line A-A' shown in the top view FIG. 7C), the field oxidation region 20 is formed to define an operation region of the high voltage MOS device 3. Next, as shown in the top view FIG. 7E and the cross-sectional view FIG. 7F (corresponding to the cross-section line A-A' shown in the top view FIG. 7E), a photoresist layer 16' is formed as a mask to define an ion implantation region of a body region 16, and second conductivity type impurities are implanted into the ion implantation region in the form of accelerated ion beam to form the second conductivity type body region 16 in the first conductivity type well 12 by an ion implantation process, wherein the body region 16 is located beneath the top surface 11' and contacts the top surface 11' in the vertical direction.

Next, as shown in the top view FIG. 7G and the cross-sectional view FIG. 7H (corresponding to the cross-section line A-A' shown in the top view FIG. 7G), a gate 33 which is not doped with impurities, is formed on the top surface 11', and part of the gate 33 stacks on and contacts right above part of the body region 16 with the second conductivity type.

Next, as shown in the top view FIG. 7I, the cross-sectional views FIG. 7J (corresponding to the cross-section line A-A' shown in the top view FIG. 7I) and FIG. 7K (corresponding to the cross-section line B-B' shown in the top view FIG. 7I), ion implantation regions of the gate 33, plural source sub-regions 341 and a drain 17 with the first conductivity type are defined by a mask formed by the field oxidation region 20, a photoresist layer 34', and a photoresist layer 17', and first conductivity type impurities are implanted into the ion implantation regions in the form of accelerated ion beam to form the first conductivity type poly-silicon layer of the gate 33, the first conductivity type source 34 (including the plural source sub-region 341) in the second conductivity type body region 16, and the first conductivity type drain 17 in the well 12 by an ion implantation process, wherein the source 34 and the drain 17 with the first conductivity type are located beneath the top surface 11' and contacts the top surface 11' in the vertical direction. As shown in FIG. 7J, the same ion implantation process which forms the source 34 and the drain 17, as indicated by downward dashed arrows shown in the figure, implants the first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 34 by the second conductivity type body region 16 and the first conductivity type well 12.

Next, as shown in the top view FIG. 7L, the cross-sectional views FIG. 7M (corresponding to the cross-section line A-A' shown in the top view FIG. 7L) and FIG. 7N (corresponding to the cross-section line B-B' shown in the top view FIG. 7L), a photoresist layer 38' is formed as a mask to define ion implantation regions of the plural body contact regions 38, and second conductivity type impurities are implanted into the ion implantation regions in the form of accelerated ion beam to form plural body contact regions 38 with the second conductivity type in the second conductivity type body region 16 by an ion implantation process, wherein each of the body contact regions 38 is located beneath the top surface 11' and contacts the top surface 11' in the vertical direction, and is in contact with the first side S1 of the gate 33 in the lateral direction individually. The plural body contact regions 38 are arranged substantially in parallel in the width direction and any two neighboring body contact regions 38 are at least partially separated from each other in the width direction. In this embodiment, any two body contact region 38 are not in contact with each other in the width direction. In this embodiment, the plural body contact regions 38 separate the source 34 into the plural source sub-regions 341; the plural source sub-regions 341 are in contact with the first side S1 of the gate 33 individually in the lateral direction, wherein the plurality source sub-region 341 are arranged substantially in parallel in the width direction and any two neighboring source sub-regions 341 are not in contact with each other in the width direction. In this embodiment, the photoresist layer 38' is formed to mask the gate 33 so that the second conductivity type impurities are not implanted into the poly-silicon layer of the gate 33 in the ion implantation process step which forms the plural body contact regions 38.

Note that, one feature of the present invention which is advantageous over the prior art is that, referring to the embodiment shown in FIGS. 7A-7N, when the plural body contact regions 38 are formed, the regions which are defined for implantation do not include any part of the gate 33. That is, when the plural body contact regions 38 are formed, the gate 33 is completely masked by the photoresist layer 38' so that the second conductivity type impurities are not implanted into the gate 33. In contrast to the present invention, the prior art high voltage MOS device 2 shown in FIGS. 2A-2E uses the gate 23 as a self-aligned mask, or a lithography process of relatively lower precision is chosen for forming the plural body contact regions 28, so P-type impurities are implanted into the gate 23 to form the P-type gate region 23" when the plural body contact regions 28 are formed. In this embodiment of the present invention, the poly-silicon layer serves as the electrical contact of the gate 33, and every portion of the entire poly-silicon layer is the first conductivity type without any second conductivity type impurities. The high voltage MOS device 3 of the present invention has a significant lower conductive resistance than that of the high voltage MOS device 2 of the prior art in ON operation.

Figure 8A:
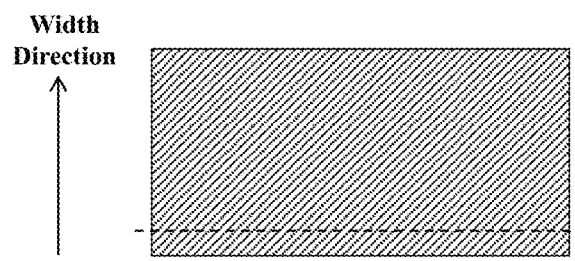
FIGS. 8A-8Q show a sixth embodiment of the present invention.
Figure 8B:
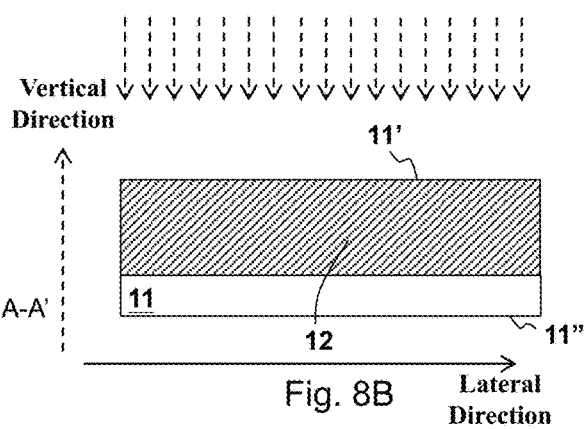
Figure 8C:
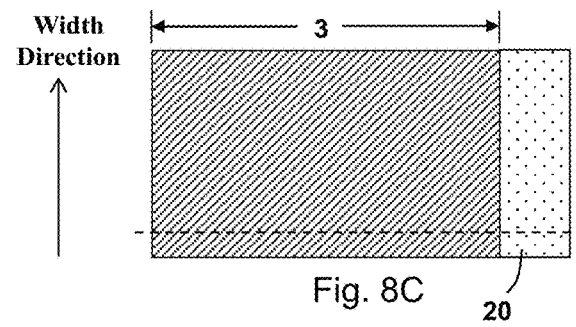
Figure 8D:
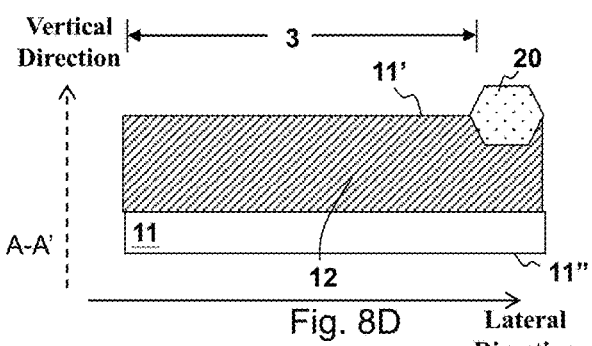
Figure 8E:
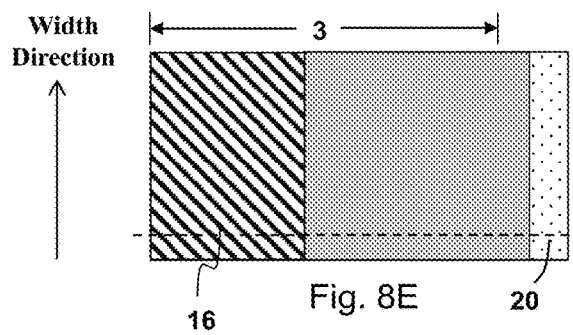
Figure 8F:
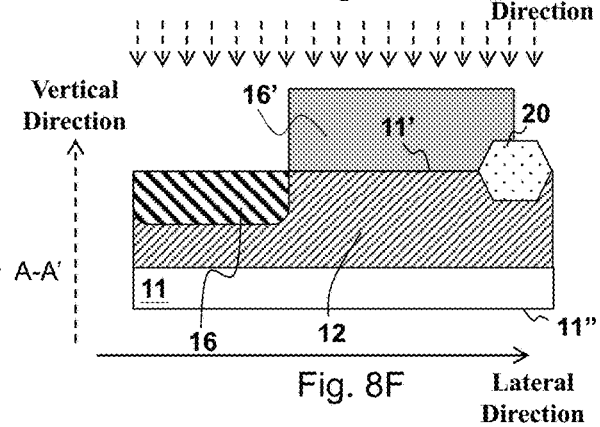
Figure 8G:
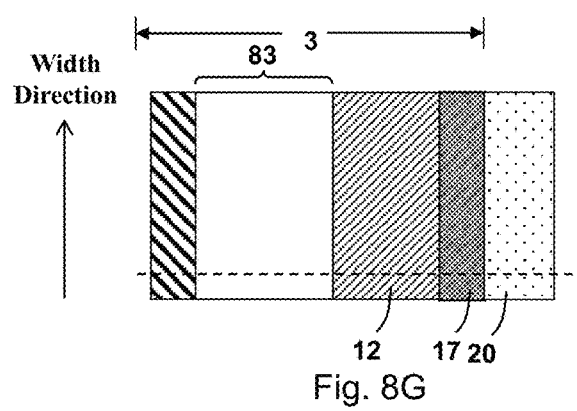
Figure 8H:
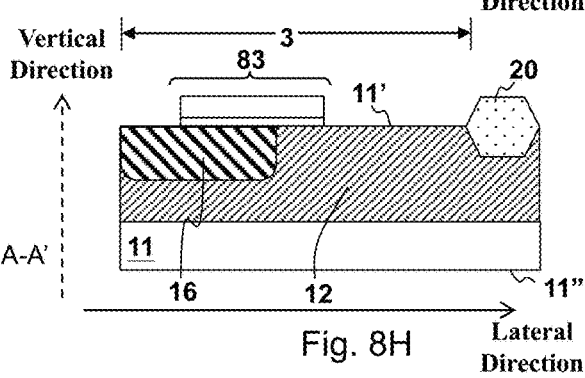
Figure 8I:
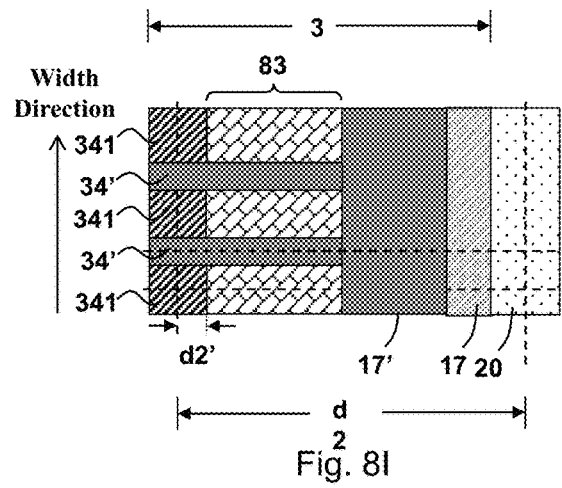
Figure 8J:
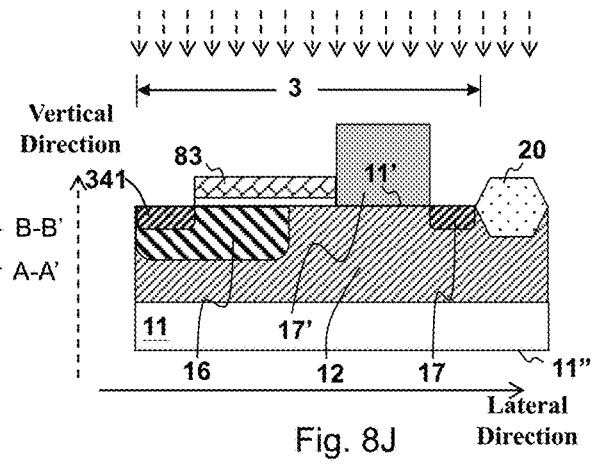
Figure 8K:
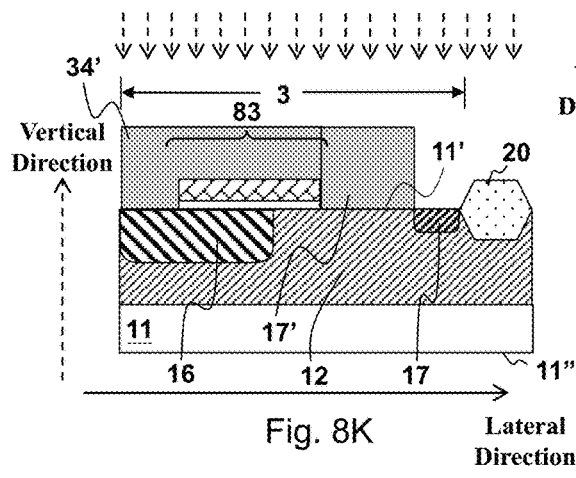
Figure 8L:
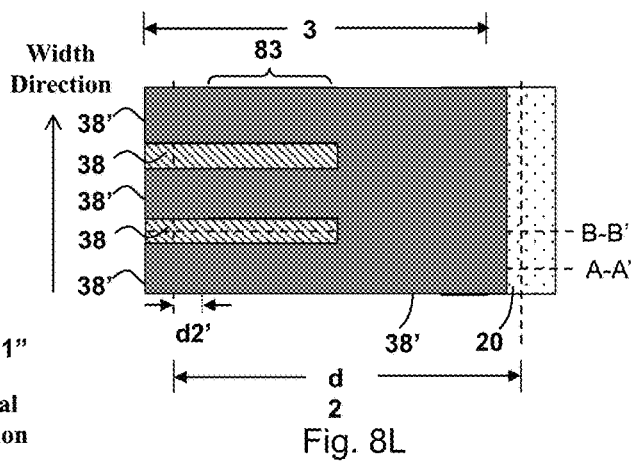
Figure 8M:
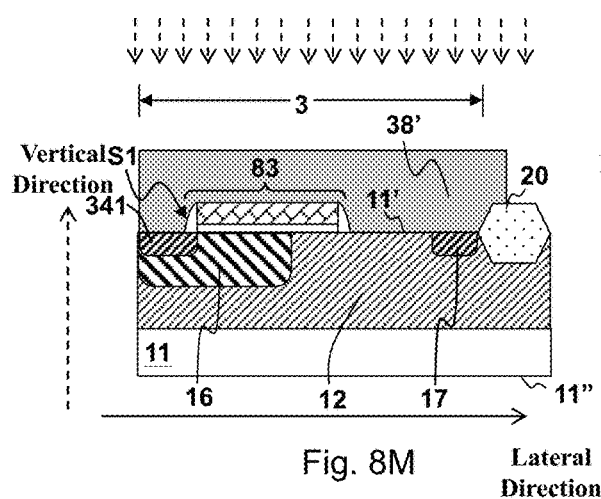
Figure 8N:
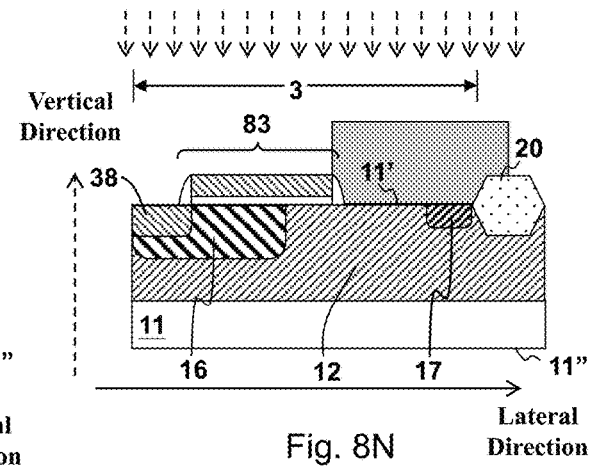
Figure 8O:
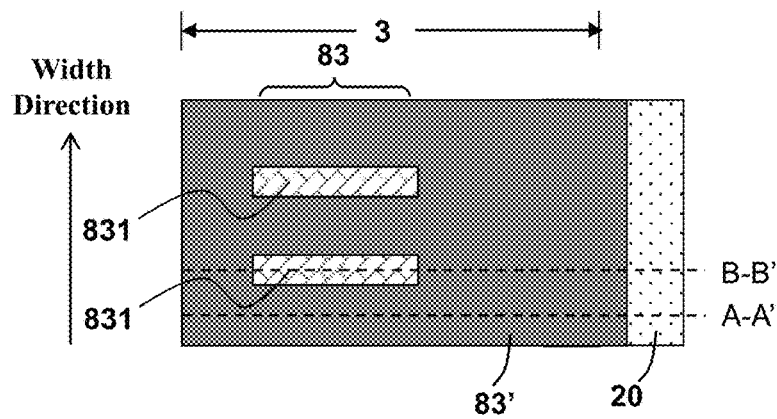
Figure 8P:
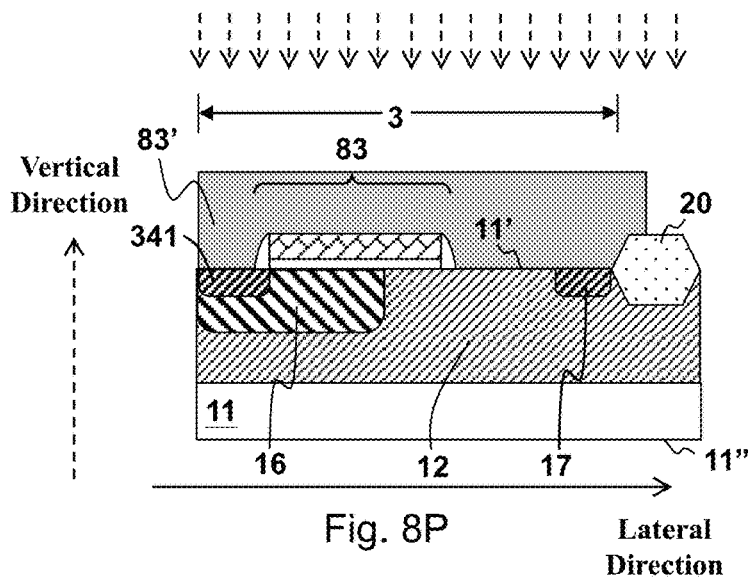
Figure 8Q:
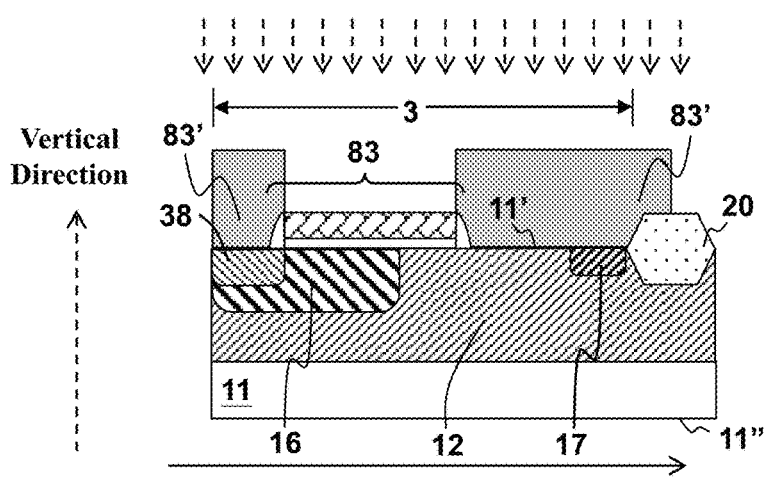

Please refer to FIGS. 8A-8Q for a sixth embodiment of the present invention. This embodiment shows a manufacturing method of the high voltage MOS device according to the present invention. This embodiment shows another manufacturing method of the high voltage MOS device, taking a high voltage MOS device similar to the high voltage MOS device 3 in the first embodiment as an example. First, as shown in the top view FIG. 8A and the cross-sectional view FIG. 8B (corresponding to the cross-section line A-A' shown in the top view FIG. 8A), a semiconductor substrate 11 is provided, wherein the semiconductor substrate 11 is for example but not limit to the P-type silicon substrate, and the semiconductor substrate 11 may be another type of semiconductor substrate. The semiconductor substrate 11 has the top surface 11' and the bottom surface 11" opposite to the top surface 11' in the vertical direction (as indicated by dashed arrows shown in FIG. 8B). Next, as shown in FIGS. 8A and 8B, a well 12 with the first conductivity type is formed in the semiconductor substrate 11, wherein the well 12 is located beneath the top surface 11' and contacts the top surface 11' in the vertical direction. The well 12 with the first conductivity type for example may be formed by processes including a lithography process, an ion implantation process and a thermal process, as well known by those skilled in the art, so details thereof are omitted here.

Next, as shown in the top view FIG. 8C and the cross-sectional view FIG. 8D (corresponding to the cross-section line A-A' shown in the top view FIG. 8C), a field oxidation region 20 is formed to define the operation region of the high voltage MOS device 3. Next, as shown in the top view FIG. 8E and the cross-sectional view FIG. 8F (corresponding to the cross-section line A-A' shown in the top view FIG. 8E), a photoresist layer 16' is formed as a mask to define the ion implantation region of a body region 16, and the second conductivity type impurities are implanted into the ion implantation region in the form of accelerated ion beam to form the second conductivity type body region 16 in the first conductivity type well 12 in an ion implantation process, wherein the body region 16 is located beneath the top surface 11' and contacts the top surface 11' in the vertical direction.

Next, as shown in the top view FIG. 8G and the cross-sectional view FIG. 8H (corresponding to the cross-section line A-A' shown in the top view FIG. 8G), a gate 83 which is not doped with impurities, is formed on the top surface 11', and part of the gate 83 stacks on and contacts right above part of the body region 16 with the second conductivity type.

Next, as shown in the top view FIG. 8I, the cross-sectional views FIG. 8J (corresponding to the cross-section line A-A' shown in the top view FIG. 8I) and FIG. 8K (corresponding to the cross-section line B-B' shown in the top view FIG. 8I), ion implantation regions of the gate 83, plural source sub-regions 341 and a drain 17 with the first conductivity type are defined by a mask formed by the field oxidation region 20, the photoresist layer 34', and the photoresist layer 17', and first conductivity type impurities are implanted into the ion implantation regions in the form of accelerated ion beam to form the first conductivity type poly-silicon layer of the gate 83, the first conductivity type source 34 (including the plural source sub-region 341) in the second conductivity type body region 16, and the first conductivity type drain 17 in the well 12 by an ion implantation process, wherein the source 34 and drain 17 with the first conductivity type are located beneath the top surface 11' and contacts the top surface 11' in the vertical direction. As shown in FIG. 7J, the same ion implantation process which forms the source 34 and the drain 17, as indicated by downward dashed arrows shown in the figure, implants the first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 34 with the first conductivity type by the second conductivity type body region 16 and the first conductivity type well 12.

Next, as shown in the top view FIG. 8L, the cross-sectional views FIG. 8M (corresponding to the cross-section line A-A' shown in the top view FIG. 8L) and FIG. 8N (corresponding to the cross-section line B-B' shown in the top view FIG. 8L), a photoresist layer 38' is formed as a mask to define ion implantation regions of plural body contact regions 38 and regions in the poly-silicon layer of the gate 83, and second conductivity type impurities are implanted into the ion implantation regions in the form of accelerated ion beam to form the second conductivity type regions in the poly-silicon layer of the gate 83 and the plural second conductivity type body contact regions 38 in the second conductivity type body region 16 by an ion implantation process, wherein each of the body contact regions 38 is located beneath the top surface 11' and contacts the top surface 11' in the vertical direction, and is in contact with the first side S1 of the gate 83 in the lateral direction individually. The plural body contact regions 38 are arranged substantially in parallel in the width direction and any two neighboring body contact regions 38 are at least partially separated from each other in the width direction. In this embodiment, any two body contact regions 38 are not in contact with each other in the width direction. In this embodiment, the plural body contact regions 38 are in contact with the first side S1 of the gate 83 individually, and separate the source 34 into the plural source sub-regions 341. The plural source sub-regions 341 are in contact with the first side S1 of the gate 83 individually in the lateral direction, and the plurality source sub-region 341 are arranged substantially in parallel in the width direction, wherein any two neighboring source sub-regions 341 are not in contact with each other in the width direction. In this embodiment, the second conductivity type impurities are implanted to the ion implantation regions in the form of accelerated ion beam (indicated by downward dashed arrows shown in FIGS. 8M and 8N) to form plural body contact regions 38 with the second conductivity type, and are also implanted into part of the poly-silicon layer of the gate 83, as shown in FIGS. 8M and 8N.

Next, as shown in the top view FIG. 8O, the cross-sectional view FIG. 8P (corresponding to the cross-section line A-A' shown in the top view FIG. 8O), and the cross-sectional view FIG. 8Q (corresponding to the cross-section line B-B' shown in the top view FIG. 8O), a photoresist layer 83' is formed as a mask to define compensation regions 831 of the gate 83, and first conductivity type impurities are implanted into the compensation regions 831 of the poly-silicon layer in the form of accelerated ion beam, to convert the regions of the poly-silicon layer with the second conductivity type to regions with the first conductivity type, such that every part of the poly-silicon layer of the gate 83 has the first conductivity type.

Please refer to FIGS. 9A-9F for a seventh embodiment of the present invention. This embodiment shows a manufacturing method of the high voltage MOS device according to the present invention. This embodiment shows a manufacturing method by taking the high voltage MOS device 4 in the second embodiment shown in FIGS. 4A-4C as an example. First several steps of the manufacturing method of this embodiment are the same as the fifth embodiment of the present invention shown in FIGS. 7A-7H.

Figure 9A:
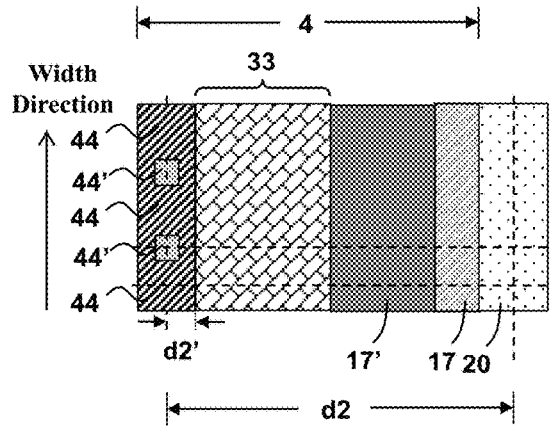
FIGS. 9A-9F show a seventh embodiment of the present invention.
Figure 9B:
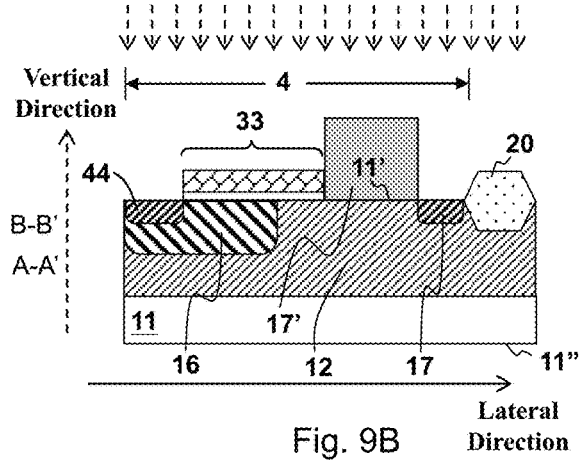
Figure 9C:
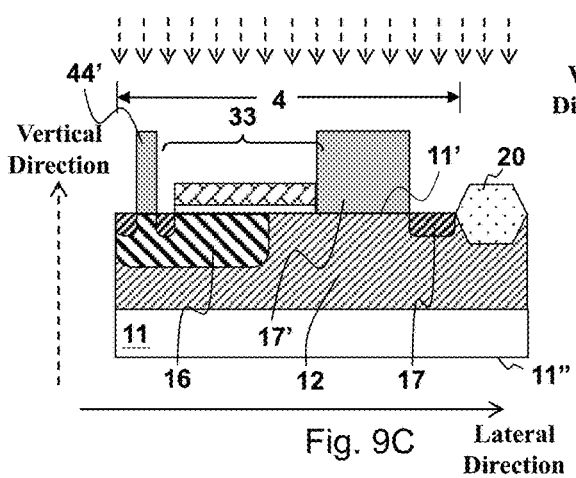

Next, as shown in the top view FIG. 9A, the cross-sectional views FIG. 9B (corresponding to the cross-section line A-A' shown in the top view FIG. 9A) and FIG. 9C (corresponding to the cross-section line B-B' shown in the top view FIG. 9A), ion implantation regions of the gate 33, the source 44 and the drain 17 with the first conductivity type are defined by a mask formed by the field oxidation region 20, a photoresist layer 44', and the photoresist layer 17', and first conductivity type impurities are implanted into the ion implantation regions in the form of accelerated ion beam to form the first conductivity type poly-silicon layer of the gate 33, the first conductivity type source 44 in the second conductivity type body region 16, and the first conductivity type drain 17 in the well 12 by an ion implantation process, wherein the source 44 and the drain 17 with the first conductivity type are located beneath the top surface 11' and contacts the top surface 11' in the vertical direction. As shown in FIGS. 9B and 9C, the same ion implantation process which forms the source 44 and the drain 17, as indicated by downward dashed arrows shown in the FIGS. 9B and 9C, implants the first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 44 with the first conductivity type by the second conductivity type body region 16 and the first conductivity type well 12.

Figure 9D:
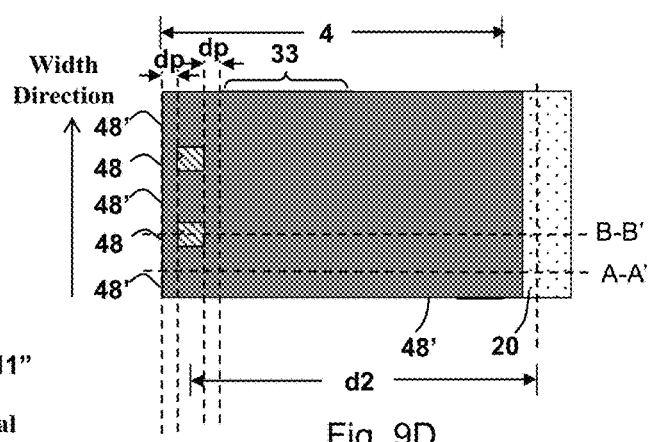
Figure 9E:
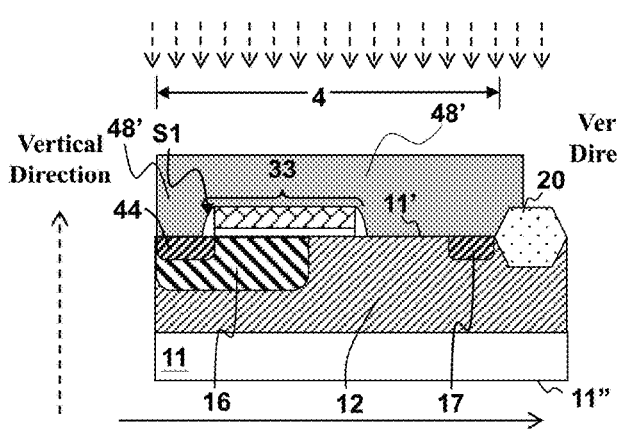
Figure 9F:
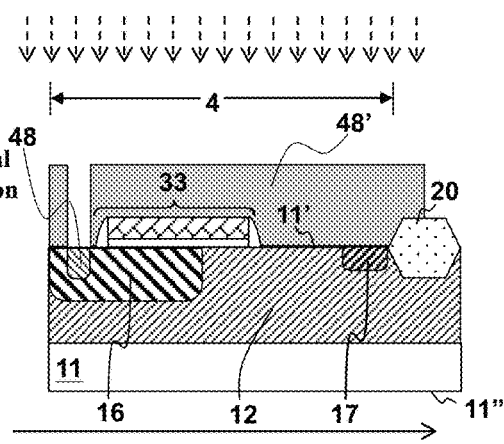

Next, as shown in the top view FIG. 9D, the cross-sectional views FIG. 9E (corresponding to the cross-section line A-A' shown in the top view FIG. 9D) and FIG. 9F (corresponding to the cross-section line B-B' shown in the top view FIG. 9D), a photoresist layer 48' is formed as a mask to define ion implantation regions of the plural body contact regions 48, and second conductivity type impurities are implanted into the ion implantation regions in the form of accelerated ion beam to form the plural second conductivity type body contact regions 48 in the second conductivity type body region 16 by an ion implantation process, wherein each of the body contact regions 48 is located beneath the top surface 11' and contacts the top surface 11' in the vertical direction, and is not in contact with the first side S1 of the gate 33 in the lateral direction. The source 44 is in contact with the first side S1 of the gate 33. In this embodiment, the photoresist layer 48' is formed to mask the gate 33 so that the second conductivity type impurities are not implanted into the poly-silicon layer of the gate 33 in the ion implantation process step which forms the plural body contact regions 48.

Note that, this embodiment is different from the fifth embodiment of the present invention shown in FIGS. 7A-7N in that, in this embodiment, the plural body contact regions 48 of the high voltage MOS device 4 are not in contact with the first side S1 of the gate 33 in the lateral direction, and each of the body contact region 48 is apart from the first side S1 of the gate 33 by at least a predetermined distance dp in the lateral direction. In this embodiment, the source 44 is a complete and continuous region and is not separated to plural source sub-regions.

Figure 10A:
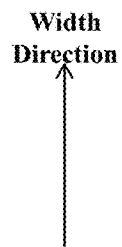
FIGS. 10A-10N show an eighth embodiment of the present invention.
Figure 10B:
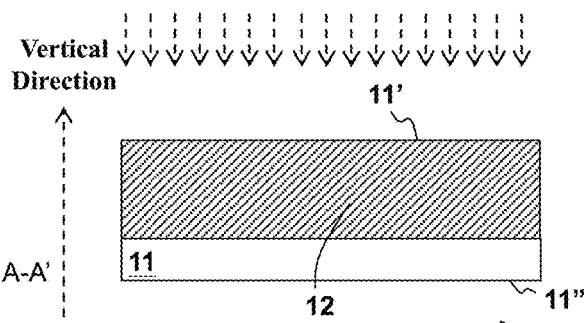
Figure 10C:
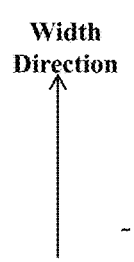
Figure 10D:
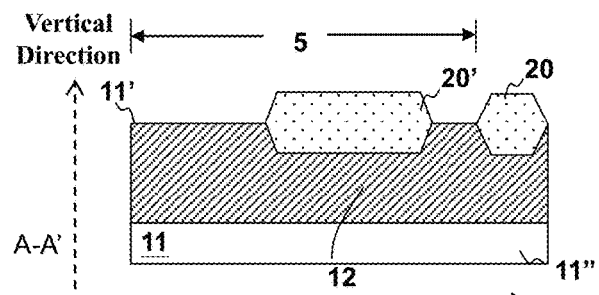
Figure 10E:
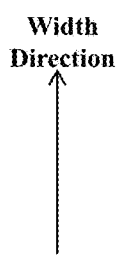
Figure 10F:
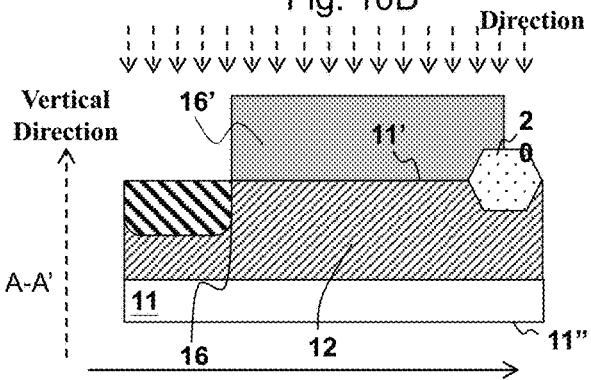
Figure 10G:
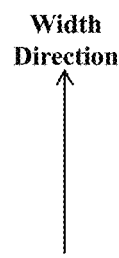
Figure 10H:
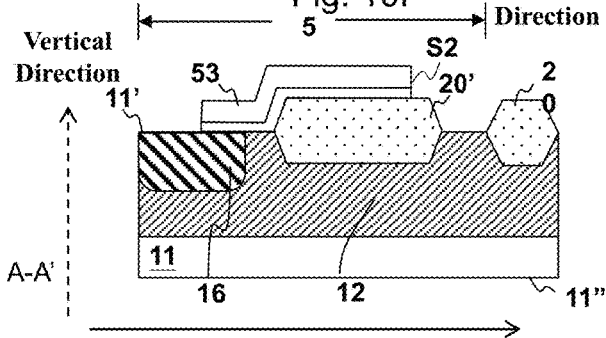
Figure 10I:
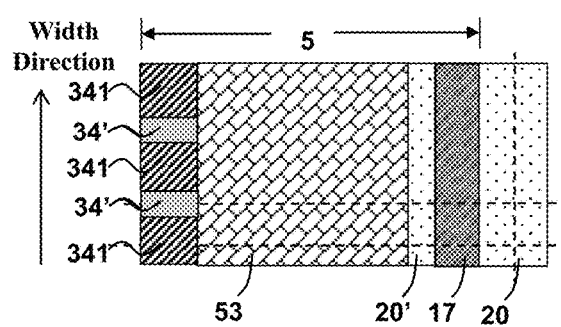
Figure 10J:
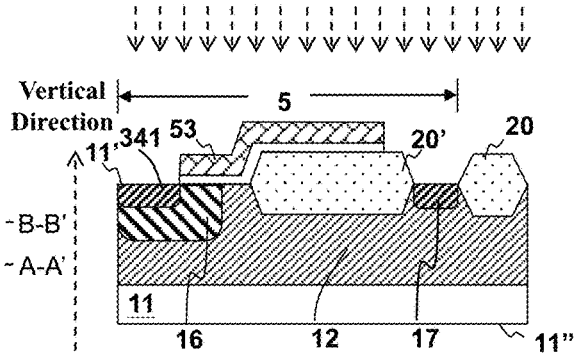
Figure 10K:
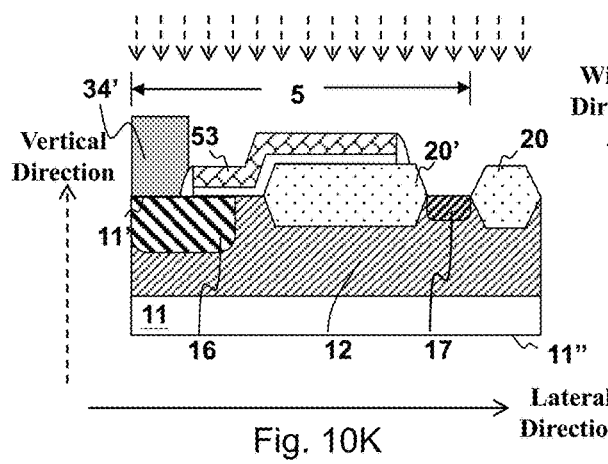
Figure 10L:
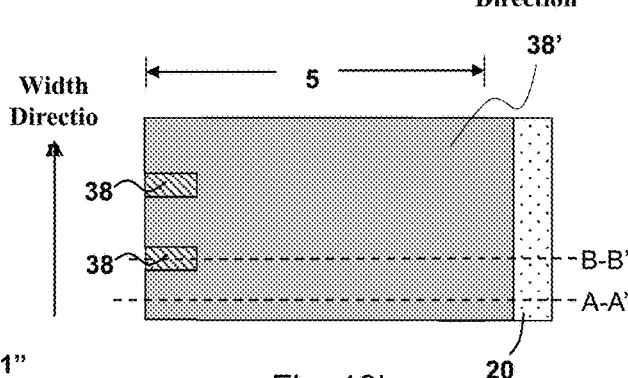
Figure 10M:
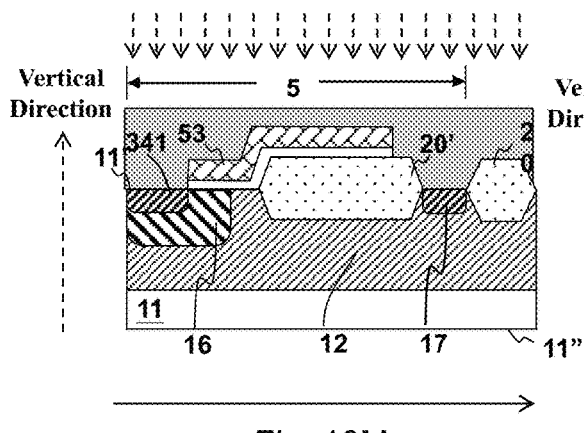
Figure 10N:
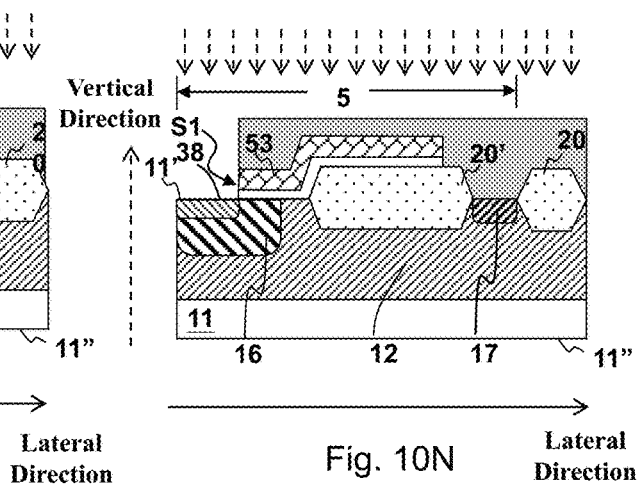

Please refer to FIGS. 10A-10N for an eighth embodiment of the present invention. This embodiment shows a manufacturing method of the high voltage MOS device according to the present invention. This embodiment shows a manufacturing method by taking the high voltage MOS device 5 in the third embodiment as an example. First, as shown in the top view FIG. 10A and the cross-sectional view FIG. 10B (corresponding to the cross-section line A-A' shown in the top view FIG. 10A), a semiconductor substrate 11 is provided, wherein the semiconductor substrate 11 is for example but not limit to a P-type silicon substrate, but the semiconductor substrate 11 may be another type of semiconductor substrate. The semiconductor substrate 11 has the top surface 11' and the bottom surface 11" opposite to the top surface 11' in the vertical direction (as indicated by dashed arrows shown in FIG. 10B). Next, as shown in FIGS. 10A and 10B, a well 12 with the first conductivity type is formed in the semiconductor substrate 11, wherein the well 12 is located beneath the top surface 11' and contacts the top surface 11' in the vertical direction. The well 12 with the first conductivity type for example can be formed by processes including a lithography process, an ion implantation process and a thermal process, as well known by those skilled in the art, so details thereof are omitted here.

Next, as shown in the top view FIG. 10C and the cross-sectional view FIG. 10D (corresponding to the cross-section line A-A' shown in the top view FIG. 10C), a field oxidation region 20 is formed to define the operation region of the high voltage MOS device 5, and a field oxide region 20' is formed on the top surface 11' at the same time, wherein the field oxide region 20' stacks on right above the well 12. Next, as shown in the top view FIG. 10E and the cross-sectional view FIG. 10F (corresponding to the cross-section line A-A' shown in the top view FIG. 10E), a photoresist layer 16' is formed as a mask to define an ion implantation region of a body region 16, and second conductivity type impurities are implanted into the ion implantation region in the form of accelerated ion beam to form the second conductivity type body region 16 in the first conductivity type well 12 by an ion implantation process, wherein the body region 16 is located beneath the top surface 11' and contacts the top surface 11' in the vertical direction.

Next, as shown in the top view FIG. 10G and the cross-sectional view FIG. 10H (corresponding to the cross-section line A-A' shown in the top view FIG. 10G), a gate 53 which is not doped with impurities, is formed on the top surface 11' and on part of the field oxide region 20'. The field oxide region 20' is formed on the top surface, and stacks on and contacts right above part of the well 12. Part of the gate 53 which is near the drain 17, including the second side S2 of the gate 53, stacks on and contacts right above at least part of the field oxide region 20'. Part of the gate 53 stacks on and contacts right above part of the second conductivity type body region 16.

Next, as shown in the top view FIG. 10I, the cross-sectional views FIG. 10J (corresponding to the cross-section line A-A' shown in the top view FIG. 10I) and FIG. 10K (corresponding to the cross-section line B-B' shown in the top view FIG. 10I), ion implantation regions of the gate 53, plural source sub-regions 341 and a drain 17 with the first conductivity type are defined by a mask formed by the field oxidation region 20 and the photoresist layer 34', and first conductivity type impurities are implanted into the ion implantation regions in the form of accelerated ion beam to form the first conductivity type poly-silicon layer of the gate 53, the first conductivity type source 34 (including the plural source sub-region 341) in the second conductivity type body region 16, and the first conductivity type drain 17 in the well 12 by an ion implantation process, wherein the source 34 and drain 17 with the first conductivity type are located beneath the top surface 11' and contacts the top surface 11' in the vertical direction. As shown in FIGS. 10J and 10K, the same ion implantation process which forms the source 34 and the drain 17, as indicated by downward dashed arrows shown in FIGS. 10J and 10K, implants first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 34 with the first conductivity type by the second conductivity type body region 16 and the first conductivity type well 12.

Next, as shown in the top view FIG. 10L, the cross-sectional views FIG. 10M (corresponding to the cross-section line A-A' shown in the top view FIG. 10L) and FIG. 10N (corresponding to the cross-section line B-B' shown in the top view FIG. 10L), a photoresist layer 38' is formed as a mask to define ion implantation regions of the plural second conductivity type body contact regions 38, and second conductivity type impurities are implanted into the ion implantation regions in the form of accelerated ion beam to form the plural second conductivity type body contact regions 38 in the second conductivity type body region 16 by an ion implantation process, wherein each of the body contact regions 38 is located beneath the top surface 11' and contacts the top surface 11' in the vertical direction, and is in contact with the first side S1 of the gate 33 in the lateral direction individually. The plural body contact regions 38 are arranged substantially in parallel in the width direction and any two neighboring body contact regions 38 are at least partially separated from each other in the width direction. In this embodiment, any two body contact regions 38 are not in contact with each other in the width direction. In this embodiment, the plural body contact regions 38 are in contact with the first side S1 of the gate 33 individually, and separate the source 34 into the plural source sub-regions 341. The plural source sub-regions 341 are in contact with the first side S1 of the gate 33 individually in the lateral direction, and the plural source sub-region 341 are arranged substantially in parallel in the width direction, wherein any two neighboring source sub-regions 341 are not in contact with each other in the width direction. In this embodiment, the second conductivity type impurities are implanted to the ion implantation regions in the form of accelerated ion beam to form plural body contact regions 38 with the second conductivity type, and the photoresist layer 38' is formed to mask the gate 33 so that the second conductivity type impurities are not implanted into the poly-silicon layer of the gate 33 in the ion implantation process step which forms the plural body contact regions 38.

Note that, one feature of the present invention which is advantageous over the prior art is that, referring to the embodiment shown in FIGS. 10A-10N, when the plural body contact regions 38 are formed, the regions which are defined for implantation do not include any part of the gate 53. That is, when the plural body contact regions 38 are formed, the gate 53 is completely masked by the photoresist layer 38' so that second conductivity type impurities are not implanted into the gate 53. In contrast to the present invention, the prior art high voltage MOS device 2 shown in FIGS. 2A-2E uses the gate 23 as a self-aligned mask, or a lithography process of relatively lower precision is chosen for forming the plural body contact regions 28, so P-type impurities are implanted into the gate 23 to form the P-type gate region 23" when the plural body contact regions 28 are formed. In this embodiment of the present invention, the poly-silicon layer serves as the electrical contact of the gate 53, and every portion of the entire poly-silicon layer is the first conductivity type without any second conductivity type impurities. The high voltage MOS device 5 of the present invention has a significant lower conductive resistance than that of the high voltage MOS device 2 of the prior art in ON operation.

Figure 11A:
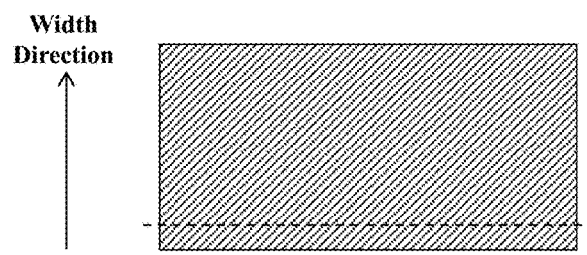
FIGS. 11A-11Q show a ninth embodiment of the present invention.
Figure 11B:
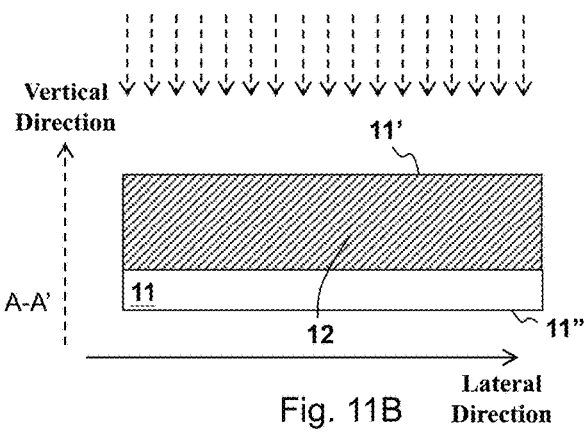
Figure 11C:
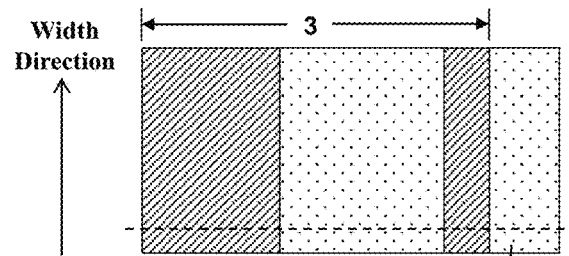
Figure 11D:
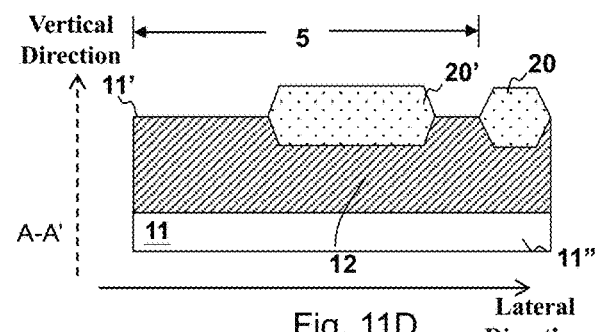
Figure 11E:
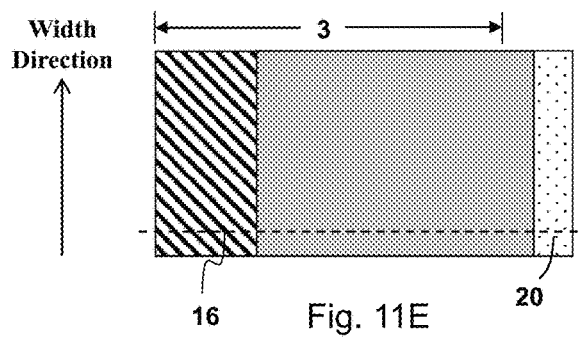
Figure 11F:
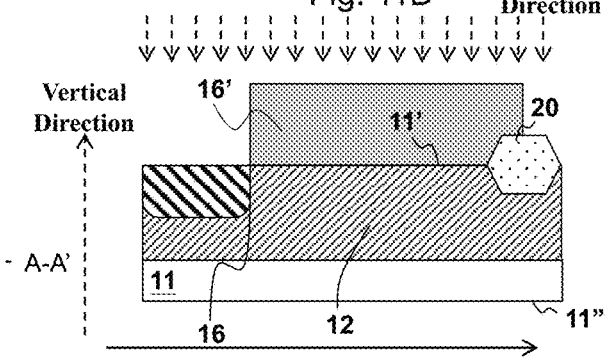
Figure 11G:
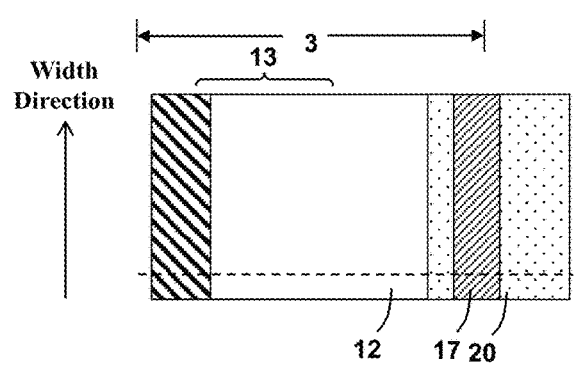
Figure 11H:
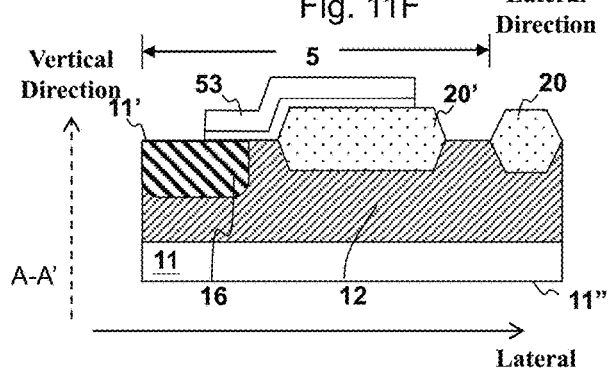
Figure 11I:
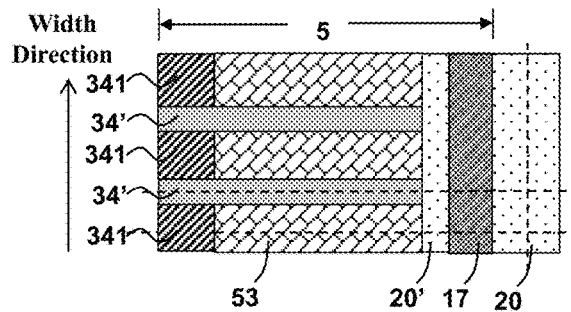
Figure 11J:
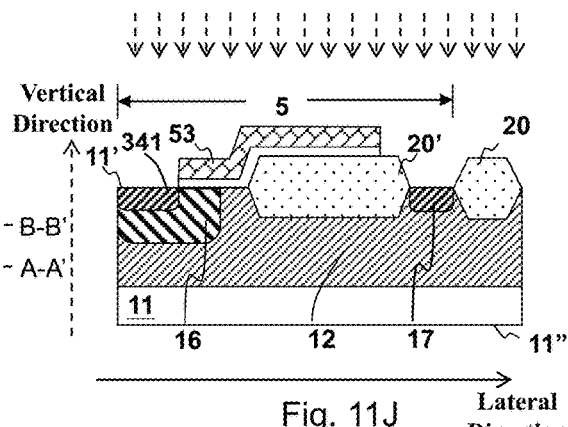
Figure 11K:
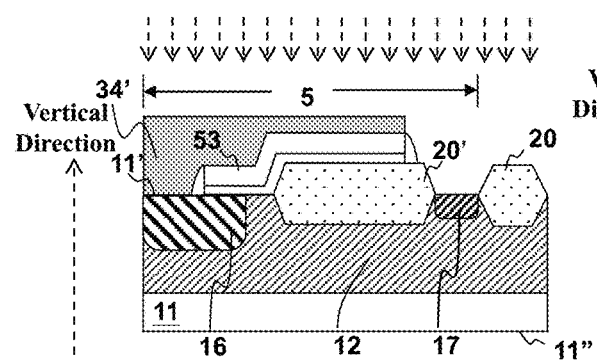
Figure 11L:
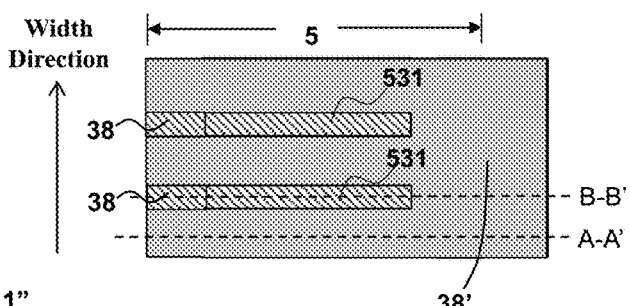
Figure 11M:
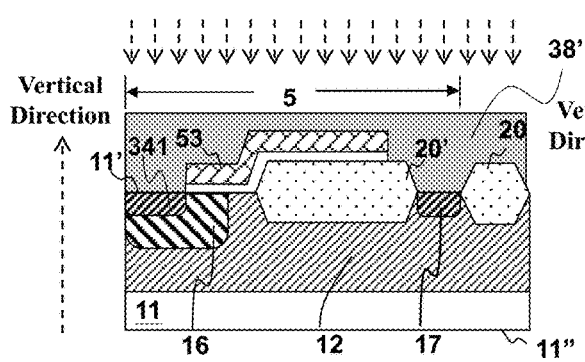
Figure 11N:
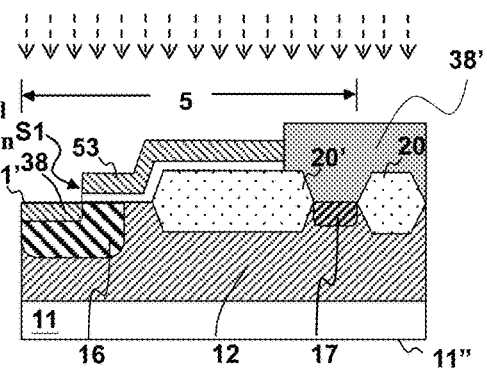
Figure 11O:
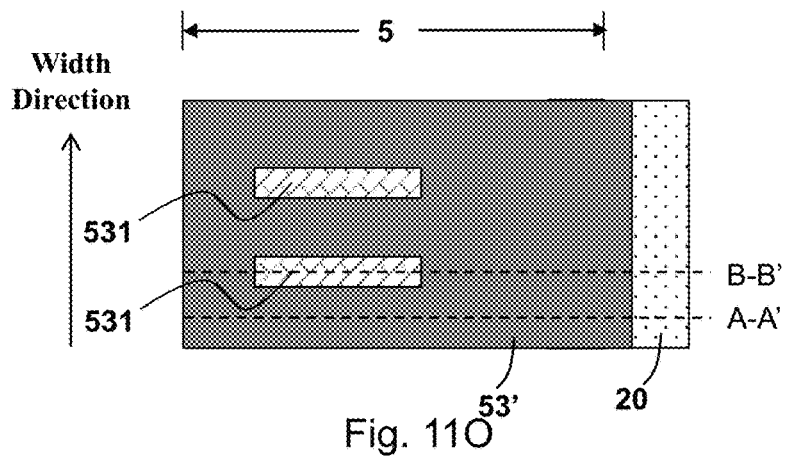
Figure 11P:
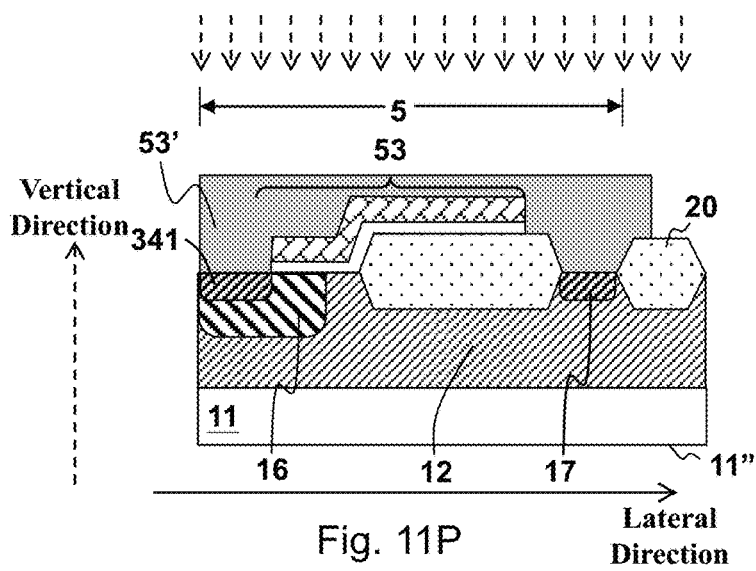
Figure 11Q:
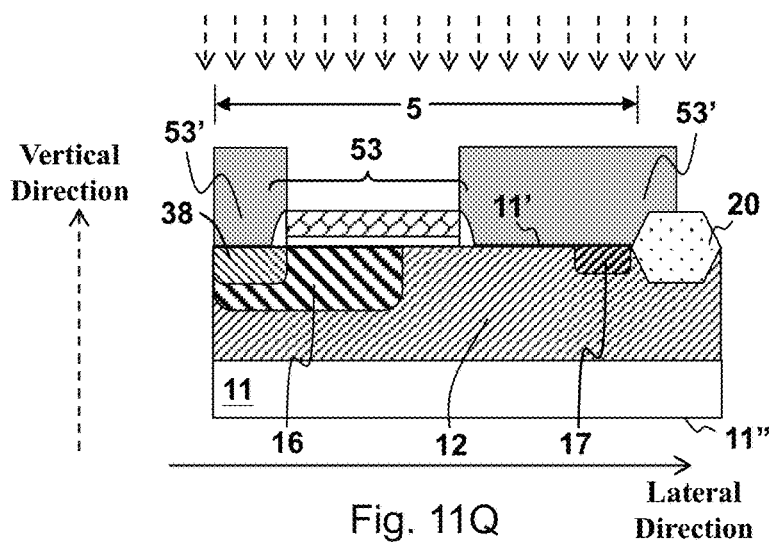

Please refer to FIGS. 11A-11Q for a ninth embodiment of the present invention. This embodiment shows a manufacturing method of the high voltage MOS device according to the present invention. This embodiment shows a manufacturing method by taking the high voltage MOS device 5 in the third embodiment as an example. First, as shown in the top view FIG. 11A and the cross-sectional view FIG. 11B (corresponding to the cross-section line A-A' shown in the top view FIG. 11A), a semiconductor substrate 11 is provided, wherein the semiconductor substrate 11 is for example but not limit to a P-type silicon substrate, but the semiconductor substrate 11 may be another type of semiconductor substrate. The semiconductor substrate 11 has the top surface 11' and the bottom surface 11" opposite to the top surface 11' in the vertical direction (as indicated by dashed arrows shown in FIG. 11B). Next, as shown in FIGS. 11A and 11B, the well 12 with the first conductivity type is formed in the semiconductor substrate 11, wherein the well 12 is located beneath the top surface 11' and contacts the top surface 11' in the vertical direction. The well 12 with the first conductivity type for example may be formed by processes including a lithography process, an ion implantation process and a thermal process, as well known by those skilled in the art, so details thereof are omitted here.

Next, as shown in the top view FIG. 11C and the cross-sectional view FIG. 11D (corresponding to the cross-section line A-A' shown in the top view FIG. 11C), a field oxidation region 20 is formed to define the operation region of the high voltage MOS device 5, and the field oxide region 20' is formed on the top surface 11' at the same time, wherein the field oxide region 20' stacks on right above the well 12. Next, as shown in the top view FIG. 11E and the cross-sectional view FIG. 11F (corresponding to the cross-section line A-A' shown in the top view FIG. 11E), a photoresist layer 16' is formed as a mask to define an ion implantation region of a body region 16, and second conductivity type impurities are implanted into the ion implantation region in the form of accelerated ion beam to form the second conductivity type body region 16 in the first conductivity type well 12 by an ion implantation process, wherein the body region 16 is located beneath the top surface 11' and contacts the top surface 11' in the vertical direction.

Next, as shown in the top view FIG. 11G and the cross-sectional view FIG. 11H (corresponding to the cross-section line A-A' shown in the top view FIG. 11G), a gate 53 which is not doped with impurities, is formed on the top surface 11' and on part of the field oxide region 20'. Part of the gate 53 stacks on and contacts right above part of the body region 16 with the second conductivity type.

Next, as shown in the top view FIG. 11I, the cross-sectional views FIG. 11J (corresponding to the cross-section line A-A' shown in the top view FIG. 11I) and FIG. 11K (corresponding to the cross-section line B-B' shown in the top view FIG. 11I), ion implantation regions of the gate 53, plural source sub-regions 341 and a drain 17 with the first conductivity type are defined by a mask formed by the field oxidation region 20 and the photoresist layer 34', and first conductivity type impurities are implanted into the ion implantation regions in the form of accelerated ion beam to form the first conductivity type poly-silicon layer of the gate 53, the first conductivity type source 34 (including the plural source sub-region 341) in the second conductivity type body region 16, and the first conductivity type drain 17 in the well 12 by an ion implantation process, wherein the source 34 and drain 17 with the first conductivity type are located beneath the top surface 11' and contacts the top surface 11' in the vertical direction. As shown in FIGS. 11J and 11K, the same ion implantation process which forms the source 34 and the drain 17, as indicated by downward dashed arrows shown in FIGS. 11J and 11K, implants the first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 34 with the first conductivity type by the second conductivity type body region 16 and the first conductivity type well 12.

Next, as shown in the top view FIG. 11L, the cross-sectional views FIG. 11M (corresponding to the cross-section line A-A' shown in the top view FIG. 11L) and FIG. 11N (corresponding to the cross-section line B-B' shown in the top view FIG. 11L), a photoresist layer 38' is formed as a mask to define ion implantation regions of the plural second conductivity type body contact regions 38 and regions in the poly-silicon layer of the gate 53, and second conductivity type impurities are implanted into the ion implantation regions in the form of accelerated ion beam to form the second conductivity type regions in the poly-silicon layer of the gate 53 and the plural second conductivity type body contact regions 38 in the second conductivity type body region 16 by an ion implantation process, wherein each of the body contact regions 38 is located beneath the top surface 11' and contacts the top surface 11' in the vertical direction, and is in contact with the first side S1 of the gate 53 in the lateral direction individually. The plural body contact regions 38 are arranged substantially in parallel in the width direction and any two neighboring body contact regions 38 are at least partially separated from each other in the width direction. In this embodiment, any two body contact regions 38 are not in contact with each other in the width direction. In this embodiment, the plural body contact regions 38 are in contact with the first side S1 of the gate 53 individually, and separate the source 34 into the plural source sub-regions 341. The plural source sub-regions 341 are in contact with the first side S1 of the gate 53 individually in the lateral direction, and the plural source sub-region 341 are arranged substantially in parallel in the width direction, wherein any two neighboring source sub-regions 341 are not in contact with each other in the width direction. In this embodiment, when the second conductivity type impurities are implanted to the ion implantation regions in the form of accelerated ion beam (indicated by downward dashed arrows shown in FIGS. 11M and 11N) to form the plural second conductivity type body contact regions 38, the second conductivity type impurities are also implanted into part of the poly-silicon layer of the gate 53 as shown in FIGS. 11M and 11N.

Next, as shown in the top view FIG. 11O, the cross-sectional view FIG. 11P (corresponding to the cross-section line A-A' shown in the top view FIG. 11O), and the cross-sectional view FIG. 11Q (corresponding to the cross-section line B-B' shown in the top view FIG. 11O), a photoresist layer 53' is formed as a mask to define compensation regions 531 of the gate 53, and first conductivity type impurities are implanted into the compensation regions 531 of the poly-silicon layer in the form of accelerated ion beam to convert the regions with the second conductivity type in the poly-silicon layer of the gate 53 to regions with the first conductivity type, such that every part of the poly-silicon layer of the gate 53 has the first conductivity type.

Please refer to FIGS. 12A-12F for a tenth embodiment of the present invention. This embodiment shows a manufacturing method of the high voltage MOS device according to the present invention. This embodiment shows a manufacturing method by taking the high voltage MOS device 6 in the second embodiment shown in FIGS. 6A-6C as an example. First several steps of the manufacturing method of this embodiment are the same as the eighth embodiment of the present invention shown in FIGS. 10A-10H.

Figure 12A:
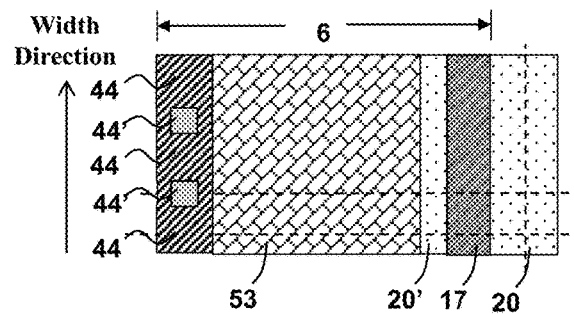
FIGS. 12A-12F show a tenth embodiment of the present invention.
Figure 12B:
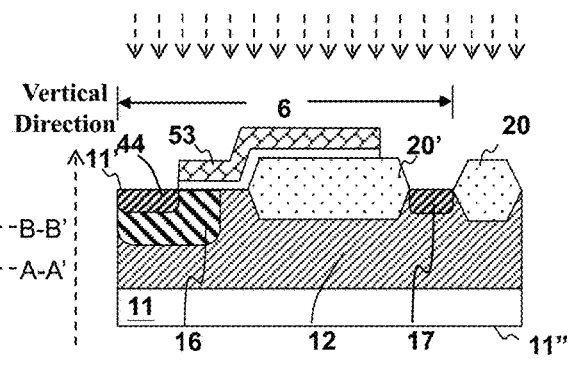
Figure 12C:
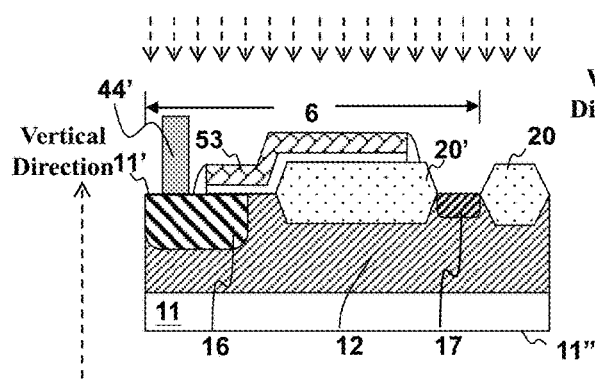

Next, as shown in the top view FIG. 12A, the cross-sectional views FIG. 12B (corresponding to the cross-section line A-A' shown in the top view FIG. 12A) and FIG. 12C (corresponding to the cross-section line B-B' shown in the top view FIG. 12A), ion implantation regions of a gate 53, a source 44 and a drain 17 with the first conductivity type are defined by a mask formed by the field oxidation region 20 and the photoresist layer 44', and first conductivity type impurities are implanted into the ion implantation regions in the form of accelerated ion beam to form the first conductivity type poly-silicon layer of the gate 53, the first conductivity type source 44 in the body region 16 with the second conductivity type, and the first conductivity type drain 17 in the well 12 by an ion implantation process, wherein the source 44 and drain 17 with the first conductivity type are located beneath the top surface 11' and contacts the top surface 11' in the vertical direction. As shown in FIGS. 12B and 12C, the same ion implantation process which forms the source 44 and the drain 17, as indicated by downward dashed arrows shown in FIGS. 12B and 12C, implants the first conductivity type impurities in the form of accelerated ion beam in the poly-silicon layer. The drain 17 with the first conductivity type is located beneath the top surface 11' and contacts the top surface 11' in the vertical direction, and the drain 17 with the first conductivity type is separated from the source 44 with the first conductivity type by the second conductivity type body region 16 and the first conductivity type well 12.

Figure 12D:
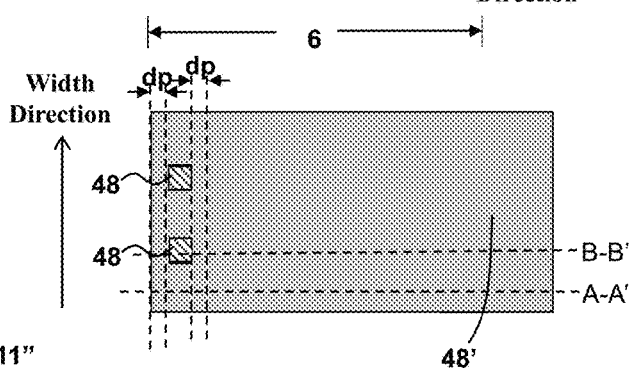
Figure 12E:
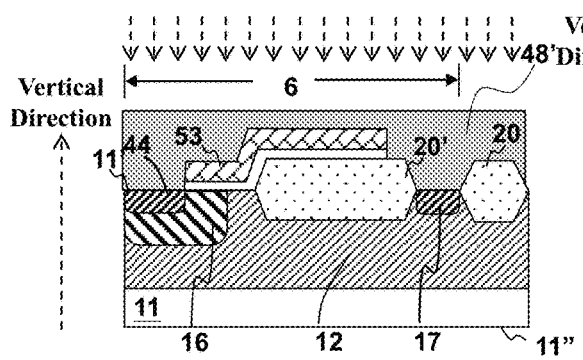
Figure 12F:
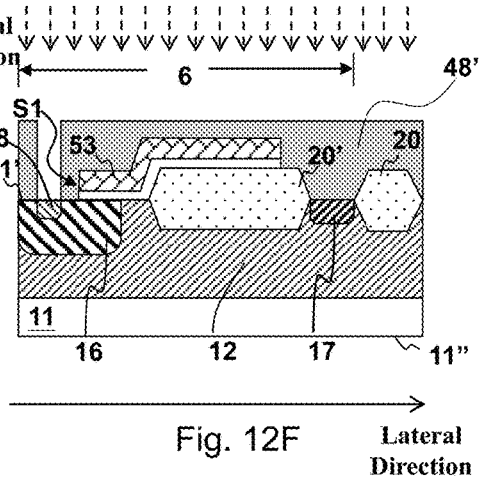

Next, as shown in the top view FIG. 12D, the cross-sectional views FIG. 12E (corresponding to the cross-section line A-A' shown in the top view FIG. 12D) and FIG. 12F (corresponding to the cross-section line B-B' shown in the top view FIG. 12D), a photoresist layer 48' is formed as a mask to define ion implantation regions of the plural second conductivity type body contact regions 48, and second conductivity type impurities are implanted into the ion implantation regions in the form of accelerated ion beam to form the plural second conductivity type body contact regions 48 in the second conductivity type body region 16 by an ion implantation process, wherein each of the body contact regions 48 is located beneath the top surface 11' and contacts the top surface 11' in the vertical direction, and is not in contact with the first side S1 of the gate 33 in the lateral direction individually. The plural body contact regions 48 are arranged substantially in parallel in the width direction and any two neighboring body contact regions 48 are at least partially separated from each other in the width direction. In this embodiment, any two body contact regions 48 are not in contact with each other in the width direction. In this embodiment, the plural body contact regions 48 are not in contact with the first side S1 of the gate 33. The source 44 is in contact with the first side S1 of the gate 53. In this embodiment, the second conductivity type impurities are implanted to the ion implantation regions in the form of accelerated ion beam to form plural body contact regions 48 with the second conductivity type, and the photoresist layer 48' is formed to mask the gate 53 so that the second conductivity type impurities are not implanted into the poly-silicon layer of the gate 53 in the ion implantation process step which forms the plural body contact regions 48.

Note that, this embodiment is different from the eighth embodiment of the present invention shown in FIGS. 10A-10N in that, in this embodiment, the plural body contact regions 48 of the high voltage MOS device 6 are not in contact with the first side S1 of the gate 53 in the lateral direction, and each of the body contact region 48 is apart from the first side S1 of the gate 53 by at least a predetermined distance dp in the lateral direction. In this embodiment, the source 44 is a complete and continuous region and is not separated to plural source sub-regions.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a threshold voltage adjustment region, etc., can be added; for another example, the lithography process described in the above can be replaced by electron beam lithography or other lithography techniques. For another example, the conductivity types of the P-type and the N-type of all the embodiments are interchangeable, with corresponding modifications of conductivity types and/or impurity concentration in other regions. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents. Furthermore, the title and abstract are provided for assisting searches but not for limiting the scope of the present invention. And, an embodiment or a claim of the present invention does not need to achieve all the objectives or advantages of the present invention.

What is claimed is:

1. A high voltage metal oxide semiconductor (MOS) device, which is formed in a semiconductor substrate, wherein the semiconductor substrate has a top surface and a bottom surface opposite to the top surface in a vertical direction perpendicular to the bottom surface, the high voltage MOS device comprising:

a well with a first conductivity type, which is formed in the semiconductor substrate, and is located beneath the top surface and contacts the top surface in the vertical direction;

a body region with a second conductivity type, which is formed in the well, and is located beneath the top surface and contacts the top surface in the vertical direction;

a gate, which is formed on the top surface, wherein part of the gate stacks on and contacts right above part of the body region in the vertical direction;

a source with the first conductivity type, which is formed in the body region, and is located beneath the top surface and contacts the top surface in the vertical direction, and the source is in contact with a first side of the gate in a lateral direction;

a plurality of body contact regions, which have the second conductivity type, and are formed in the body region, wherein each of the body contact regions is located beneath the top surface and contacts the top surface in the vertical direction, wherein the body contact regions are arranged substantially in parallel in a width direction and any two neighboring body connecting regions are at least partially separated from each other in the width direction; and a drain with the first conductivity type, which is formed in the well and is located beneath the top surface and contacts the top surface in the vertical direction, and the drain is located outside a second side of the gate, wherein the source and the drain are separated by the body region and the well;

wherein the gate includes a poly-silicon layer serving as an electrical contact of the gate, and all the poly-silicon layer has the first conductivity type;

wherein the lateral direction is parallel to a direction from the source to the drain;

wherein the width direction is perpendicular to the lateral direction and parallel to the bottom surface.

2. The high voltage MOS device of claim 1, further comprising a field oxide region, which is formed on the top surface, and stacks on and contacts right above part of the well, wherein part of the gate which is near the drain, including the second side of the gate, stacks on and contacts right above at least part of the field oxide region.

3. The high voltage MOS device of claim 1, wherein the body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

4. The high voltage MOS device of claim 2, wherein the body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

5. The high voltage MOS device of claim 1, wherein the body contact regions are not in contact with the first side of the gate in the lateral direction, and each of the body contact region is apart from the first side of the gate by at least a predetermined distance.

6. The high voltage MOS device of claim 2, wherein the body contact regions are not in contact with the first side of the gate in the lateral direction, and each of the body contact region is apart from the first side of the gate by at least a predetermined distance.

7. The high voltage MOS device of claim 5, wherein the predetermined distance is not less than 0.05 micrometers.

8. The high voltage MOS device of claim 6, wherein the predetermined distance is not less than 0.05 micrometer.

9. A manufacturing method of a high voltage metal oxide semiconductor (MOS) device, comprising:

providing a semiconductor substrate which has a top surface and a bottom surface opposite to the top surface in a vertical direction perpendicular to the bottom surface;

forming a well with a first conductivity type in the semiconductor substrate, wherein the well is located beneath the top surface and contacts the top surface in the vertical direction;

forming a body region with a second conductivity type in the well, wherein the body region is located beneath the top surface and contacts the top surface in the vertical direction;

forming a gate on the top surface, wherein part of the gate stacks on and contacts right above part of the body region in the vertical direction;

forming a source with the first conductivity type in the body region, wherein the source is located beneath the top surface and contacts the top surface in the vertical direction, and the source is in contact with a first side of the gate in a lateral direction;

forming a plurality of body contact regions with the second conductivity type in the body region, wherein each of the body contact regions is located beneath the top surface and contacts the top surface in the vertical direction, wherein the body contact regions are arranged substantially in parallel in a width direction and any two neighboring body contact regions are at least partially separated from each other in the width direction, and forming a drain with the first conductivity type in the well, wherein the drain is located beneath the top surface and contacts the top surface in the vertical direction, and the drain is located outside a second side of the gate, wherein the source and the drain are separated by the body region and the well;

wherein the gate includes a poly-silicon layer which serves as an electrical contact of the gate, and all the poly-silicon layer has the first conductivity type;

wherein the lateral direction is parallel to a direction from the source to the drain;

wherein the width direction is perpendicular to the lateral direction and parallel to the bottom surface.

10. The manufacturing method of claim 9, further comprising: forming a field oxide region on the top surface, wherein the field oxide region stacks on and contacts right above part of the well, wherein part of the gate which is near the drain, including the second side of the gate, stacks on and contacts right above at least part of the field oxide region.

11. The manufacturing method of claim 9, wherein the body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

12. The manufacturing method of claim 10, wherein the body contact regions are in contact with the first side of the gate individually in the lateral direction, and separate the source into a plurality of source sub-regions, wherein the plural source sub-regions are in contact with the first side of the gate in the lateral direction, wherein the plural source sub-regions are arranged substantially in parallel in the width direction and any two neighboring source sub-regions are not in contact with each other in the width direction.

13. The manufacturing method of claim 9, wherein the body contact regions are not in contact with the first side of the gate in the lateral direction, and each of the body contact region is apart from the first side of the gate by at least a predetermined distance.

14. The manufacturing method of claim 10, wherein the body contact regions are not in contact with the first side of the gate in the lateral direction, and each of the body contact region is apart from the first side of the gate by at least a predetermined distance.

15. The manufacturing method of claim 13, wherein the predetermined distance is not less than 0.05 micrometer.

16. The manufacturing method of claim 14, wherein the predetermined distance is not less than 0.05 micrometer.

17. The manufacturing method of claim 9, wherein the step of forming the gate comprises:
   implanting first conductivity type impurities in the poly-silicon layer in a form of accelerated ion beam by a first ion implantation process step which is a same process step of forming the source and/or the drain; and
   forming a photoresist layer to mask the gate so that the second conductivity type impurities are not implanted into the poly-silicon layer in a second ion implantation process step which is a same process step of forming the body contact regions.

18. The manufacturing method of claim 9, wherein the step of forming the gate comprising:
   implanting first conductivity type impurities in the poly-silicon layer in a form of accelerated ion beam by a first ion implantation process step which is a same process step of forming the source and/or the drain; and
   implanting the first conductivity type impurities in the poly-silicon layer in the form of accelerated ion beam by a second ion implantation process step to convert a region of the poly-silicon layer having the second conductivity type to the first conductivity type so that every part of the poly-silicon layer has the first conductivity type.

* * * * *